(12) United States Patent
Park et al.

(10) Patent No.: US 12,425,748 B2
(45) Date of Patent: Sep. 23, 2025

(54) ELECTRONIC DEVICE INCLUDING IMAGE SENSOR

(71) Applicant: SAMSUNG ELECTRONICS CO., LTD., Suwon-si (KR)

(72) Inventors: Jaehyoung Park, Suwon-si (KR); Hwayong Kang, Suwon-si (KR); Dongsoo Kim, Suwon-si (KR); Takafumi Usui, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 196 days.

(21) Appl. No.: 18/091,875

(22) Filed: Dec. 30, 2022

(65) Prior Publication Data

US 2023/0135693 A1     May 4, 2023

Related U.S. Application Data

(63) Continuation of application No. PCT/KR2021/005376, filed on Apr. 28, 2021.

(30) Foreign Application Priority Data

Jun. 30, 2020    (KR) .................. 10-2020-0079989

(51) Int. Cl.
*H04N 25/11*     (2023.01)
*H04N 23/10*     (2023.01)
*H04N 23/84*     (2023.01)

(52) U.S. Cl.
CPC ............. *H04N 25/11* (2023.01); *H04N 23/10* (2023.01); *H04N 23/84* (2023.01)

(58) Field of Classification Search
None
See application file for complete search history.

(56) References Cited

U.S. PATENT DOCUMENTS

| | | |
|---|---|---|
| 7,626,154 B2 | 12/2009 | Sei et al. |
| 9,136,299 B2 | 9/2015 | Tay |
| 9,363,425 B2 | 6/2016 | Black |
| 9,638,951 B2 | 5/2017 | Wang et al. |

(Continued)

FOREIGN PATENT DOCUMENTS

| | | |
|---|---|---|
| CN | 103081457 A | 5/2013 |
| JP | 2007-6038 A | 1/2007 |

(Continued)

OTHER PUBLICATIONS

Communication dated Oct. 25, 2023, issued by the European Patent Office in counterpart European Application No. 21833800.2.

(Continued)

*Primary Examiner* — Paul M Berardesca
(74) *Attorney, Agent, or Firm* — Sughrue Mion, PLLC

(57) ABSTRACT

An electronic device includes: a color filter array including a plurality of color filters having a first grid pattern; an image sensor including the color filter array; and at least one processor electrically connected to the image sensor. The at least one processor is configured to acquire image data via unit pixels of a pixel array having a second grid pattern forming an angle of 45 degrees with respect to the first grid pattern. At least two of the plurality of color filters have different colors and the at least two of the plurality of color filters correspond to the unit pixels.

14 Claims, 20 Drawing Sheets

(A)

(B)

(56) References Cited

U.S. PATENT DOCUMENTS

| | | |
|---|---|---|
| 9,716,868 B1 | 7/2017 | Mao |
| 10,044,947 B2 | 8/2018 | Mabuchi |
| 11,056,526 B2 | 7/2021 | Kanai et al. |
| 2007/0018073 A1 | 1/2007 | Hsu et al. |
| 2007/0070225 A1 | 3/2007 | Sei et al. |
| 2010/0309351 A1 | 12/2010 | Smith et al. |
| 2013/0161774 A1 | 6/2013 | Okigawa |
| 2014/0022354 A1* | 1/2014 | Okigawa ............. H04N 13/207 348/46 |
| 2014/0071244 A1* | 3/2014 | Hirota ................. H04N 13/204 348/46 |
| 2015/0319412 A1 | 11/2015 | Koshiba et al. |
| 2016/0323555 A1 | 11/2016 | Suzuki |
| 2018/0006077 A1 | 1/2018 | Lee |
| 2019/0214421 A1 | 7/2019 | Kim et al. |
| 2019/0259795 A1 | 8/2019 | Jang et al. |

FOREIGN PATENT DOCUMENTS

| | | |
|---|---|---|
| JP | 2015-177243 A | 10/2015 |
| JP | 5789446 B2 | 10/2015 |
| JP | 6031835 B2 | 11/2016 |
| KR | 10-2007-0032946 A | 3/2007 |
| KR | 10-2018-0004480 A | 1/2018 |
| KR | 10-2019-0084780 A | 7/2019 |
| KR | 10-2019-0100792 A | 8/2019 |

OTHER PUBLICATIONS

Communication issued Aug. 30, 2024 by the Korean Patent Office for KR Patent Application No. 10-2020-0079989.
Office Action issued Jun. 21, 2024 by the Korean Patent Office for KR Patent Application No. 10-2020-0079989.
K. Lee and H. Yoo, "Demosaicking of Hexagonally-Structured Bayer Color Filter Array", The Transactions of the Korean Institute of Electrical Engineers vol. 63, No. 10, pp. 1434-1440, http://dx.doi.org/10.5370/KIEE.2014.63.10.1434, ISSN 1975-8359(Print) / ISSN 2287-4364(Online), 2014, (7 pages total).
International Search Report (PCT/ISA/210) dated Aug. 9, 2021, issued by the International Searching Authority in International Application No. PCT/KR2021/005376.
Written Opinion (PCT/ISA/237) dated Aug. 9, 2021, issued by the International Searching Authority in International Application No. PCT/KR2021/005376.
European Extended Search Report issued Nov. 7, 2024 by the European Patent Office for EP Patent Application No. 21833800.2.
Office Action issued on May 14, 2025 by the Chinese Patent Office in corresponding CN Patent Application No. 202180045859.2.

\* cited by examiner

ELECTRONIC DEVICE INCLUDING IMAGE SENSOR

CROSS-REFERENCE TO RELATED APPLICATIONS

This application is a by-pass continuation application of International Application No. PCT/KR2021/005376, filed on Apr. 28, 2021, which based on and claims priority to Korean Patent Application No. 10-2020-0079989, filed on Jun. 30, 2020, in the Korean Intellectual Property Office, the disclosures of which are incorporated by reference herein in their entireties.

BACKGROUND

1. Field

The disclosure relates to an electronic device including an image sensor.

2. Description of Related Art

In general, in a case of a mobile terminal, an image sensor such as a Charge Coupled Device (CCD) or a Complementary Metal Oxide Semiconductor (CMOS) is employed. Such an image sensor detects a brightness value of light, and thus, an image acquired through the image sensor is a black-and-white image, not a color image. Therefore, a color filter array for passing a red, a green, and a blue component is disposed in each pixel of the image sensor to acquire a color image.

As the color filter array is disposed, respective pixels of the image sensor detect a red, a green, and a blue color value of the light having passed through the color filter array. Each pixel acquires only one color value (e.g., red) corresponding to the color filter among multiple color values, and thus, an image signal processor obtains all color values (e.g., red, green, and blue) of pixels via interpolation from color values of neighboring pixels.

In a process of acquiring light through a color filter array of an image sensor, there is a phenomenon of cross talk for each wavelength, and thus, it may be difficult to distinguish and read specific wavelengths. Even though the image sensor divides a wavelength and outputs the wavelength, an image signal processor may not effectively consider edge information of an image and may not fully consider the correlation between colors, and thus, at the time of color interpolation, an object may be interpolated with a color completely different from the original color at an edge such as an outline or a boundary line of the object. A false color error (a phenomenon in which some pixels visibly jump out of harmony with the surroundings) or color distortion (that makes a colorful image like a rainbow in a pattern area such as a checked pattern image) may occur.

The above problems may be minimized in an image sensor having a large number of pixels capable of outputting red, green, and blue color values while maintaining a color center. However, a maximum number of individual pixels are required to output color values by minimizing color errors, and thus, it may be difficult to output color values while minimizing color errors and maintaining color centers in an image sensor having a relatively small number of pixels. In addition, currently, there is a limit to increasing the number of pixels in all mobile terminals.

SUMMARY

According to an aspect of the disclosure, an electronic device includes: a color filter array including a plurality of color filters having a first grid pattern; an image sensor including the color filter array; and at least one processor electrically connected to the image sensor. The at least one processor is configured to acquire image data via unit pixels of a pixel array having a second grid pattern forming an angle of 45 degrees with respect to the first grid pattern. At least two of the plurality of color filters have different colors and the at least two of the plurality of color filters correspond to the unit pixels.

According to another aspect of the disclosure, an electronic device includes: a color filter array including a plurality of color filters having a first grid pattern; an image sensor including the color filter array; and at least one processor electrically connected to the image sensor. The at least one processor is configured to acquire image data via unit pixels in a pixel array having a second grid pattern forming an angle of 45 degrees with respect to the first grid pattern. Each of the unit pixels in the pixel array include (i) a first area corresponding to a quadrangle in each color filter included in the plurality of color filters and (ii) a second area corresponding to an area excluding the first area.

According to another aspect of the disclosure, the quadrangle is a rhombus-shaped area.

According to one or more embodiments disclosed herein, it is possible to solve a problem that the resolution may be lowered due to the discrepancy of the phases of colors.

In addition, according to one or more embodiments, even an image sensor having a relatively low pixel may improve color reproducibility by minimizing color errors or color distortion. In addition, according to one or more embodiments, processing speed and power consumption may be improved by omitting some of the processing performed by an image signal processor. Various effects directly or indirectly identified via the disclosure may be provided.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Hereinafter, one or more embodiments of the disclosure are described with reference to the attached drawings. However, it is not intended to limit the disclosure to specific embodiments, and it should be understood that various modifications, equivalents, and/or alternatives of the embodiments of the disclosure are included.

Figure 1:
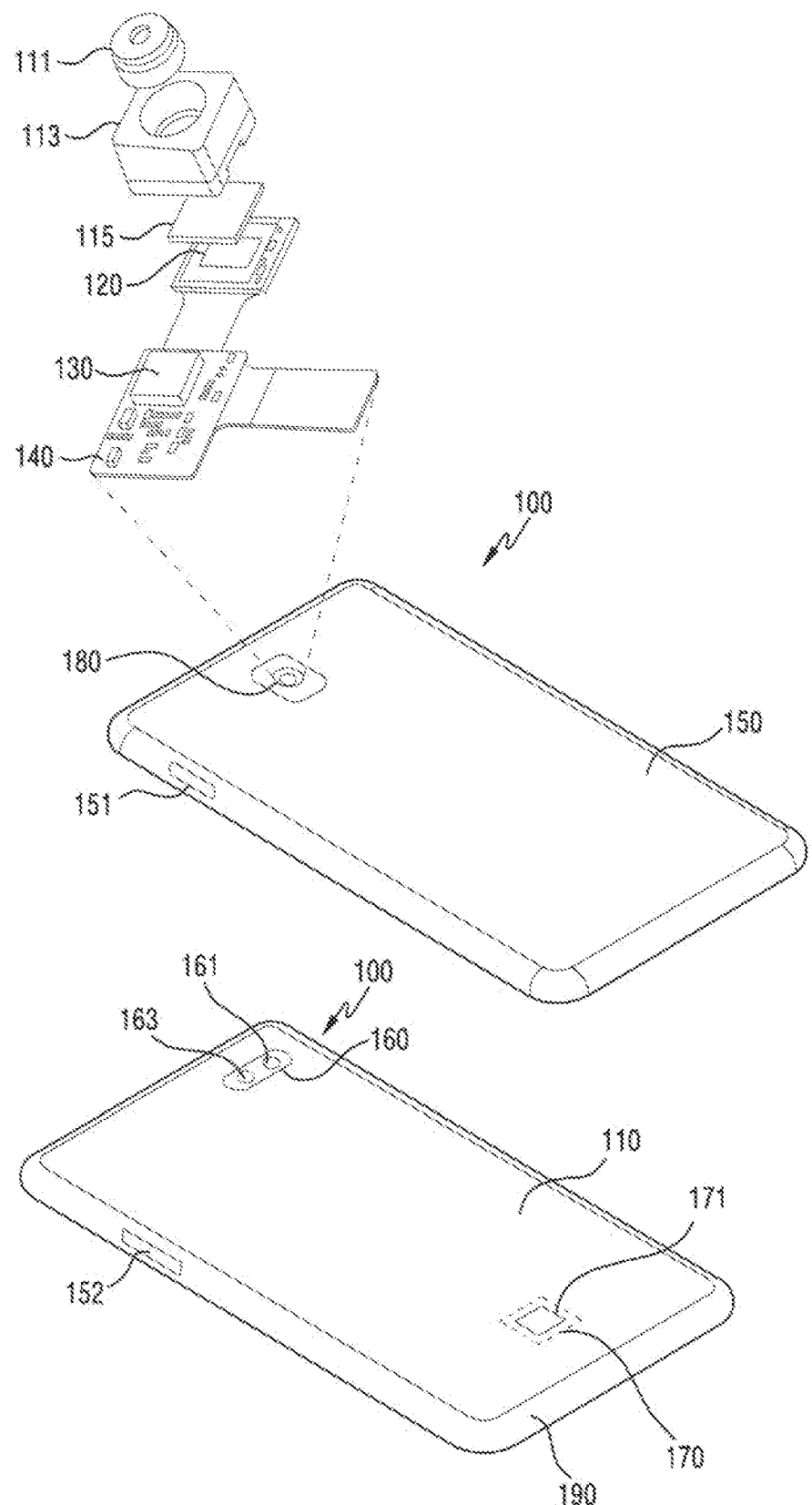
FIG. 1 illustrates a structure for a camera module and an electronic device according to an embodiment.

FIG. 1 illustrates a structure for a camera module 180 and an electronic device 100 according to an embodiment. FIG. 1 illustrates the camera module 180 and an outer appearance of the electronic device 100 to which the camera module 180 is mounted, according to an embodiment. The embodiment of FIG. 1 has been illustrated and described on the premise of a mobile device, in particular, a smartphone. However, it will be clearly understood by a person skilled in the art that the embodiment may be applied to an electronic device having a camera among various electronic devices or mobile devices.

Referring to FIG. 1, a display 110 may be disposed on a front surface of the electronic device 100 according to an embodiment. In an embodiment, the display 110 may occupy most of the front surface of the electronic device 100. The display 110 and a bezel 190 area surrounding at least a portion of edges of the display 110 may be arranged on the front surface of the electronic device 100. The display 110 may include a flat area and a curved area extending from the flat area toward a side surface of the electronic device 100. The electronic device 100 illustrated in FIG. 1 is one example, and one or more embodiments are possible. For example, the display 110 of the electronic device 100 may include only a flat area without a curved area, or include a curved area on one edge of only one side thereof instead of edges of opposite sides thereof. In addition, in an embodiment, a curved area may extend to a rear surface of an electronic device, and thus the electronic device 100 may include an additional flat area.

In an embodiment, the electronic device 100 may further include a speaker, a receiver, a front camera, a proximity sensor, a home key, and the like. In the electronic device 100 according to an embodiment, a rear cover 150 may be provided integrally with a main body of the electronic device. In another embodiment, the rear cover 150 may be separated from the main body of the electronic device 100 to have a form which allows a battery to be replaced. The rear cover 150 may be referred to as a battery cover or a rear surface cover.

In an embodiment, a fingerprint sensor 171 configured to recognize a user's fingerprint may be disposed in a first area 170 of the display 110. The fingerprint sensor 171 may be disposed on a layer under the display 110, and may thus be disposed not to be viewed or to be difficult to be viewed by a user. Further, in addition to the fingerprint sensor 171, a sensor for additional user/biometric authentication may be disposed in a partial area of the display 110. In another embodiment, the sensor for user/biometric authentication may be disposed in one area of the bezel 190. For example, an IR sensor for iris authentication may be exposed through one area of the display 110 or exposed through one area of the bezel 190.

In an embodiment, a front camera 161 may be disposed in a second area 160 of the first surface of the electronic device 100. In FIG. 1, the front camera 161 is exposed through one area of the display 110. In another embodiment, the front camera 161 may be exposed through the bezel 190. The electronic device 100 may include one or more front cameras 161. For example, the electronic device 100 may include two front cameras such as a first front camera and a second front camera. In an embodiment, the first front camera and the second front camera may be cameras of the same type having the same specifications (e.g., pixels), but the first front camera and the second front camera may be implemented as cameras having different specifications. The electronic device 100 may support a function related to a dual camera (e.g., three-dimensional (3D) photographing, auto focus, etc.) through the two front cameras.

In an embodiment, in the electronic device 100, various hardware or a sensor 163 configured to assist photographing, such as a flash, may be additionally disposed. For example, a distance sensor (e.g., Time-Of-Flight (TOF) sensor) configured to detect a distance between a subject and the electronic device 100, and the like, may be further included. This may be applied to both the front camera and a rear camera.

In an embodiment, at least one physical key may be disposed at a side surface part of the electronic device 100. For example, a first function key 151 configured to turn on/off the display 110 or turn on/off the power of the electronic device 100 may be disposed on the right edge with reference to the front surface of the electronic device 100. In an embodiment, a second function key 152 configured to control the volume or screen brightness of the electronic device 100 may be disposed on the left edge with reference to the front surface of the electronic device 100. In addition to this, an additional button or a key may be disposed on the front surface or the rear surface of the electronic device 100. For example, a touch button or a physical button mapped to a specific function may be disposed in a lower end area of the bezel 190 of the front surface.

The electronic device 100 illustrated in FIG. 1 corresponds to one example, and does not limit the shape of the device to which the technical idea disclosed in the disclosure is applied. For example, the technical idea of the disclosure may also be applied to a tablet, a notebook computer, or a foldable electronic device that can be folded in a horizontal direction or in a vertical direction, by adopting a flexible display and a hinge structure. In addition, the technical idea may also be applied in a case where it is possible that the first camera and the second camera facing the same direction are arranged to face in different directions through rotation, folding, deformation, etc. of the device.

Referring to FIG. 1, the electronic device 100 according to an embodiment may include the camera module 180. The camera module 180 may include a lens assembly 111, a housing 113, an infrared cut filter 115, an image sensor 120, and an image signal processor 130.

In an embodiment, the camera module 180 may include a barrel configured to mount at least one lens aligned on an optical axis and a housing 113 configured to mount at least one coil surrounding the circumference of the barrel around the optical axis.

In an embodiment, the infrared cut filter 115 may be disposed on an upper surface of the image sensor 120. An image of a subject having passed through the lens may be partially filtered by the infrared cut filter 115 and then detected by the image sensor 120.

In an embodiment, the image sensor 120 may be disposed on an upper surface of a printed circuit board. The image sensor 120 may be electrically connected, by a connector, to the image signal processor 130 connected to the printed circuit board 140. As the connector, a flexible printed circuit board (FPCB), a cable, or the like may be used.

In an embodiment, the image sensor 120 may be a complementary metal oxide semiconductor (CMOS) sensor or a charged coupled device (CCD) sensor. A plurality of individual pixels is integrated in the image sensor 120, and each individual pixel may include a micro lens, a color filter, and a photodiode. Each individual pixel is a kind of photodetector and may convert input light into an electrical signal. Generally, a photodetector cannot detect the wavelength of captured light by itself and cannot determine color information. The photodetector may include a photodiode.

In an embodiment, light information of a subject, incident through the lens assembly 111 may be converted into an electrical signal by the image sensor 120 and be input to the image signal processor 130.

In an embodiment, the camera module 180 may be disposed on the front surface as well as the rear surface of the electronic device 100. In addition, the electronic device 100 may include not only one camera module 180 but also multiple camera modules to improve the performance of the camera. For example, the electronic device 100 may further include the front camera 161 for a video call or self-camera photography. The front camera 161 may support a relatively low number of pixels compared to the rear camera module. The front camera may be relatively smaller than the rear camera module.

Figure 2:
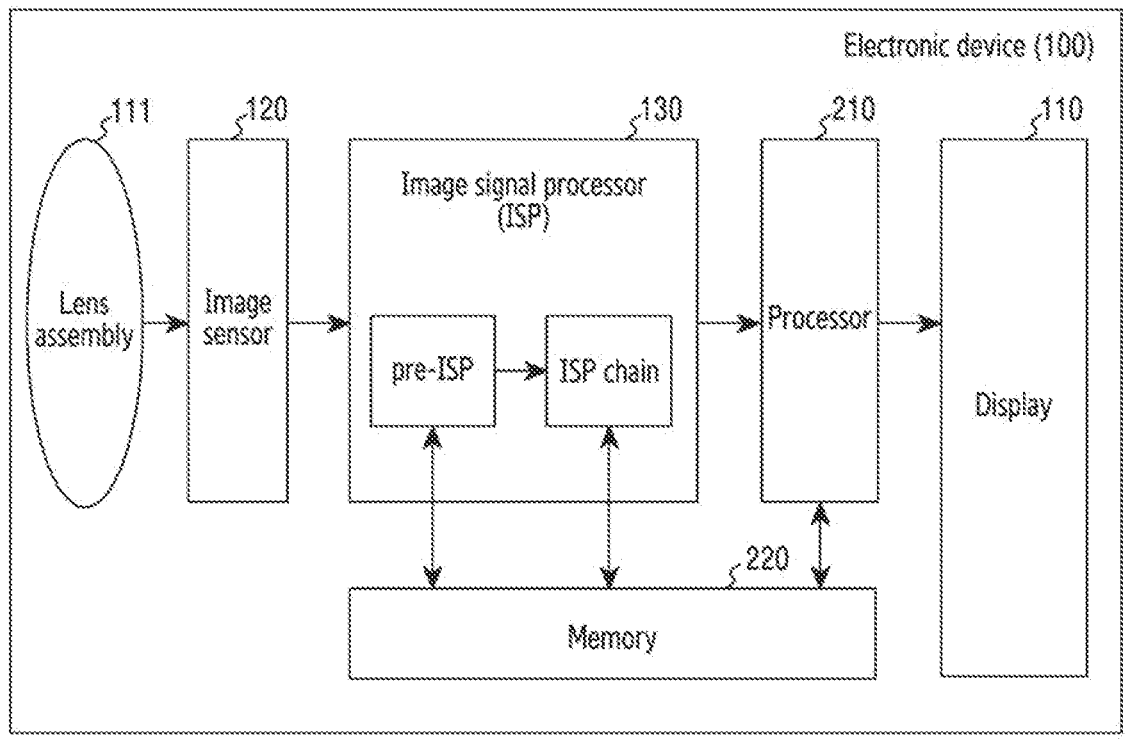
FIG. 2 illustrates a configuration of main hardware of an electronic device according to an embodiment.

FIG. 2 illustrates a configuration of main hardware of an electronic device 100 according to an embodiment. In the description of FIG. 2, the configuration described in FIG. 1 may be briefly described or a description thereof may be omitted.

Referring to FIG. 2, in an embodiment, the electronic device 100 may include a lens assembly 111, an image sensor 120, an image signal processor 130, a processor 210, a display 110, and a memory 220.

In an embodiment, numbers, arrangements, types, and the like of lenses of the lens assemblies 111 may be different from each other depending on whether the lens assembly belongs to the front camera or the rear camera. According to the type of the lens assembly 111, the front camera and the rear camera may have characteristics (e.g., focal length, maximum magnification, etc.) different from each other.

In an embodiment, in a case where the image signal processor 130 and the image sensor 120 are physically separated, there may be a sensor interface conforming to the standard.

In an embodiment, the image signal processor 130 may perform image processing on the electrically converted image data. A process in the image signal processor 130 may be divided into a pre-ISP (hereinafter, pre-processing) and an ISP chain (hereinafter, post-processing). Image processing before a demosaicing process may refer to pre-processing, and image processing after the demosaicing process may refer to post-processing. The pre-processing process may include 3 A processing, lens shading correction, edge enhancement, dead pixel correction, knee correction, and the like. The 3 A may include at least one of auto white balance (AWB), auto exposure (AE), and auto focusing (AF). The post-processing process may include at least one of changing a sensor index value, changing a tuning parameter, and adjusting an aspect ratio. The post-processing process may include a process of processing the image data output from the image sensor 120 or image data output from a scaler. The image signal processor 130 may adjust contrast, sharpness, saturation, dithering, etc. of the image through the post-processing process. Contrast, sharpness, and saturation adjustment procedures may be performed in a YUV color space, and a dithering procedure may be performed in a Red Green Blue (RGB) color space. The image signal processor 130 may transmit the image data obtained after processing the post-processing process to the memory 220 (e.g., a display buffer). The display 110 may display the image data stored in the memory 220 (e.g., a display buffer) on the display screen under the control of the processor 210.

In an embodiment, the processor 210 may execute/control various functions supported by the electronic device 100. For example, the processor 210 may execute a code written in a programming language stored in the memory 220 to be capable of executing an application and controlling various hardware. For example, the processor 210 may execute an application supporting a photographing function stored in the memory 220. In addition, the processor 210 may configure and support an appropriate photographing mode to execute a camera module (e.g., the camera module 180 of FIG. 1) and allow the camera module 180 to perform an operation intended by a user.

In an embodiment, instructions executable by the processor 210 may be stored in the memory 220. The memory 220 may be conceptually understood to include a component in which data is temporarily stored, such as a random access memory (RAM), and/or a component in which data is permanently stored, such as a solid state drive (SSD). For example, the processor 210 may implement a software module in a RAM space by calling instructions stored in an SSD. In one or more embodiments, the memory 220 may include various types, and an appropriate type may be adopted according to the purpose of the device.

In an embodiment, an application related to the camera module 180 may be stored in the memory 220. For example, a camera application may be stored in the memory 220. The camera application may support various shooting functions such as photo shooting, video shooting, panoramic shooting, and slow motion shooting.

In an embodiment, the processor 210 may display, on the display 110, contents such as an execution screen of an application executed by the processor 210 or an image and/or a video stored in the memory 220. In addition, the processor 210 may display image data acquired through the camera module 180 on the display 110 in real time.

Figure 3:
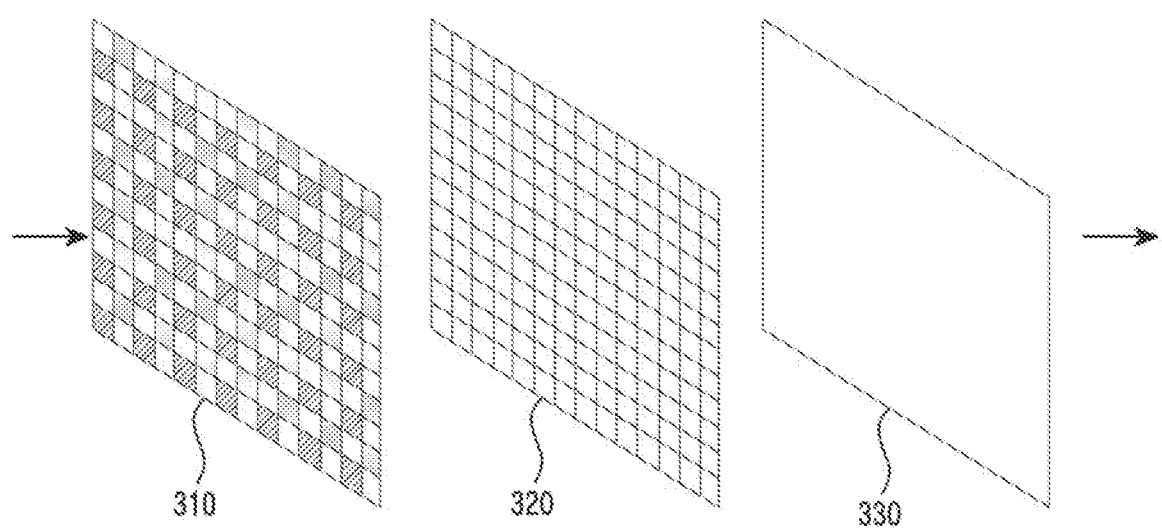
FIG. 3 illustrates a path in which light information is acquired in an electronic device according to an embodiment.

FIG. 3 illustrates a path in which light information is acquired in an electronic device 100 according to an embodiment.

In an embodiment, the light information may pass through a color filter array 310, a photodiode 320 (a light receiving unit or a light receiver), and a data operation unit (a data operator) 330 to be provided to, to be attached to, or to be included in the image signal processor 130 or the processor 210. The processor 210 (or the image signal processor 130) may acquire image data including color values.

In an embodiment, the color filter array 310 may be an array of small color filters capable of overlapping individual pixels of the image sensor 120 and filtering captured light by wavelength. For example, the color filter array 310 may be a Bayer color filter array configured to provide a filter pattern that is a 50% green filter, a 25% red filter, and a 25% blue filter. The image sensor 120 using the Bayer color filter array may obtain color values and information about the intensity of light received by the lens assembly 111, based on green, red, and blue wavelengths. The green, red, and blue colors are only examples of color values, and the color values are not limited. The color value may be at least one among red, green, blue, yellow, emerald, white, cyan, and magenta. According to one or more embodiments, the color filter array 310 may include a color filter array of a red, green, blue, emerald (RGBE) pattern, a cyan, yellow, yellow, magenta (CYYM) pattern, a cyan, yellow, green, magenta (CYGM) pattern, or a red, green, blue, and white (RGBW) pattern. The image sensor 120 may acquire light information including at least all of the visible ray wavelength region through the color filter patterns of the various examples.

In an embodiment, the photodiode 320 (the light receiving unit) may be electrically connected to the color filter array 310. For example, an electric circuit such as a metal wire between the photodiode 320 and the color filter array 310 may be configured.

In an embodiment, the photodiode 320 may include pixels separated by an optically or electrically insulating structure, to prevent crosstalk between wavelengths. The photodiode 320 may react when light comes to produce an electron and produce an analog signal.

In an embodiment, pixels of the photodiode 320 may be arranged to correspond to individual color filters of the color filter array 310. For example, pixels of the photodiode 320 may be arranged such that the number and size of the pixels of the photodiode 320 are the same as the number and size of the individual color filters of the color filter array 310.

In an embodiment, the size of each pixel of the photodiode 320 may not be the same as the size of one color filter. Each pixel of the photodiode 320 may be provided to have a size smaller than that of an individual color filter. Each pixel of the photodiode 320 may be arranged in a size equally divided in the individual color filter. For example, each pixel of the photodiode 320 may be arranged in various shapes, such as 2×2 or 3×3, corresponding to one color filter.

In an embodiment, the data operation unit 330 may perform a data operation such as binning to obtain an RGB value. The data operation may be performed before analog digital conversion (ADC) and may be performed before preprocessing of the image signal processor 130 via a sensor interface. The binning may be divided into analog binning and digital binning. The analog binning may refer to outputting an average value of the color values of each individual pixel using an analog circuit. The digital binning may refer to converting color values of a plurality of individual pixels converted into digital signals into one color value by using a predetermined formula. That is, the binning may include averaging adjacent groups of the same color pixels in each frame of raw image data.

Figure 4:
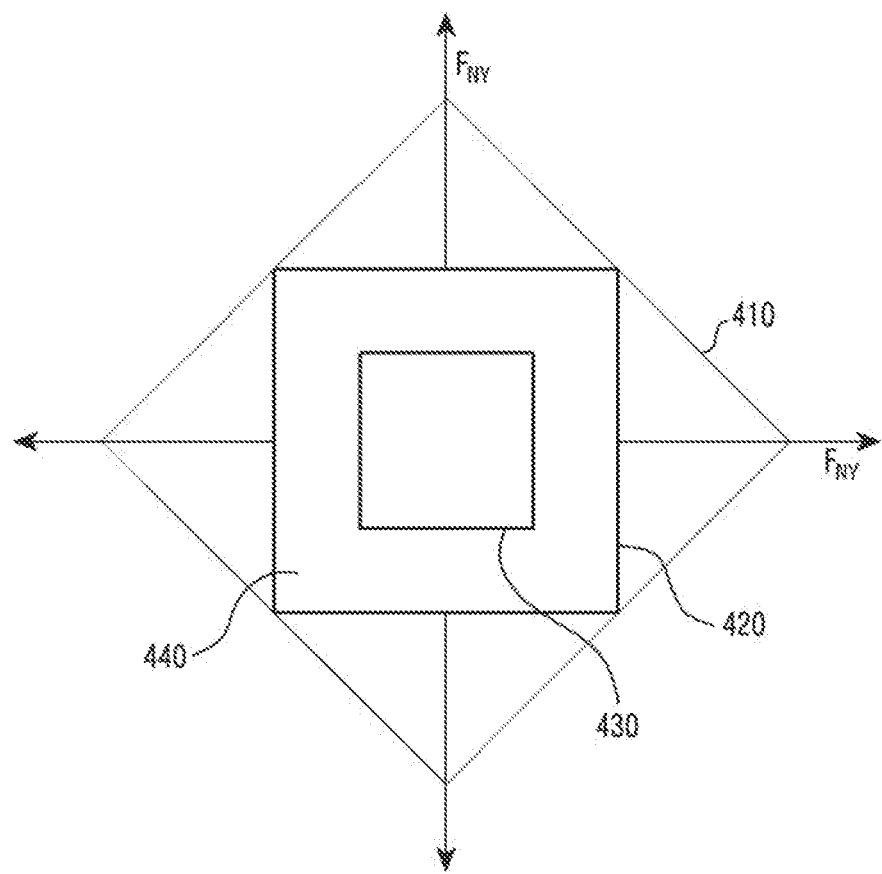
FIG. 4 illustrates a frequency domain capable of expressing a color via a color filter array of a Bayer pattern in an image sensor of an electronic device according to an embodiment.

FIG. 4 illustrates a frequency domain capable of expressing a color via a color filter array 310 of a Bayer pattern in an image sensor 120 of an electronic device 100 according to an embodiment.

In an embodiment, an area 410 briefly shows a resolution in which a green color may be expressed, by using a Nyquist frequency. The area 410 shows that a resolution of ½ of all the pixels of the image sensor 120 may be represented with a green color.

In an embodiment, an area 420 is a brief representation of a resolution in which a red color or a blue color may be expressed, by using a Nyquist frequency. The area 420 shows that a resolution of ¼ of all the pixels of the image sensor 120 may be represented with the red color or the blue color. As noted from the area 420, the range of resolution in which the red color or the blue color may be expressed is ½ of the range of the resolution in which the green color may be expressed.

In an embodiment, an area 430 is a brief representation of a resolution in which the image sensor 120 may output a red color, a green color, and a blue color by reducing a phase shift, by using a Nyquist frequency. The area 430 may have a resolution of 1/16 of all the pixels of the image sensor 120.

In the embodiment, an area 440 may show an area of wasted red and blue pixels. When R, G, and B are output in the area 430 which is narrower than the area 420 in which a red color and a blue color may be expressed, the red color and the blue color may have a resolution loss as much as the area 440, and the green color may have a resolution loss as much as an area which is the area 410 excluding the area 430.

Figure 5:
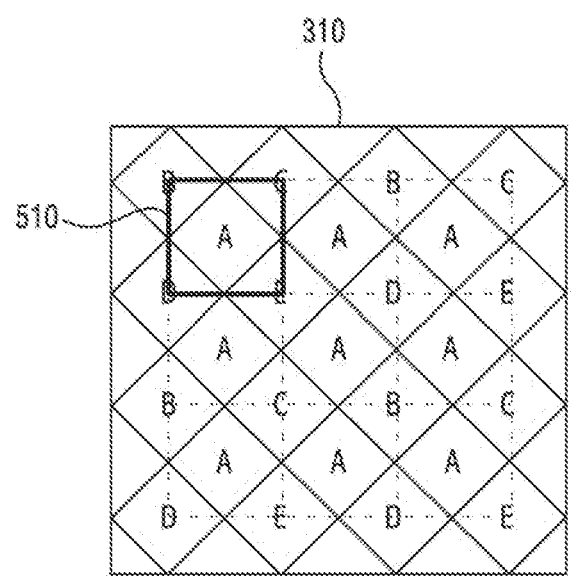
FIG. 5 illustrates a color filter array and a unit pixel in an electronic device according to an embodiment.

FIG. 5 illustrates a color filter array 310 and a unit pixel 510 in an electronic device 100 according to an embodiment. In an embodiment, FIG. 5 shows the color filter array 310 that may be implemented as a pattern inclined at 45 degrees with respect to a Bayer pattern output from the image sensor 120.

The color filter array 310 may include a plurality of color filters having a first grid pattern (solid line). Referring to FIG. 5, a pixel array having a second grid pattern (dotted line) forming an angle of 45 degrees with respect to the first grid pattern may be defined. The unit pixel 510 of the pixel array may form an angle of 45 degrees with respect to an individual pixel of the color filter array 310. The unit pixel 510 may be an effective pixel expressed in an image.

In an embodiment, the unit pixel 510 may be a quadrangular area circumscribing a color filter of a representative color or a larger quadrangular area. The representative color, for example, may be a green color of a RGBG filter, a yellow color of a CYYM filter, or a white color. Alternatively, the representative color may be any one among a red color, a blue color, an emerald color, a cyan color, and a magenta color, according to the pattern of the color filter array.

In an embodiment, the unit pixel 510 may include a color filter of a representative color. The unit pixel 510 may include at least two among all the colors included in the color filter array. For example, the unit pixel 510 may correspond not only to a green filter, but also correspond to a portion of a red filter and a portion of a blue filter.

In an embodiment, when a binning process is performed in the image sensor 120 or the image signal processor 130, a "B" filter and an "E" filter may have the same color to prevent a color phase shift. A "C" filter and a "D" filter may have the same color. For example, the "A" filter may be a green filter, the "B" filter and the "E" filter may be red filters, and the "C" filter and the "D" filter may be blue filters. Otherwise, the "A" filter may be a yellow color filter, the "B" filter and the "E" filter may be cyan color filters, and the "C" filter and the "D" filter may be magenta color filters. The example is merely an embodiment, and the filters may be variously arranged at the level of a person skilled in the art according to a pattern of the color filter array 310.

In an embodiment, at least one among the A filter to the E filter may be a white filter. When the color filter array 310 includes the white filter, the entire visible light area may be passed through the color filter array 310, thereby helping to improve sensitivity.

Figure 6:
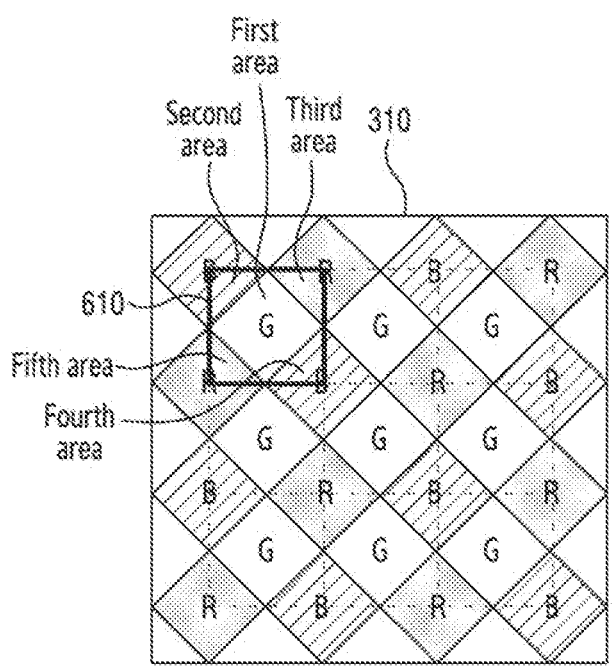
FIGS. 6 (A and B) illustrates a unit pixel and a frequency expression area in a case where a photographing resolution of an electronic device is a first resolution, according to an embodiment.
Figure 6:
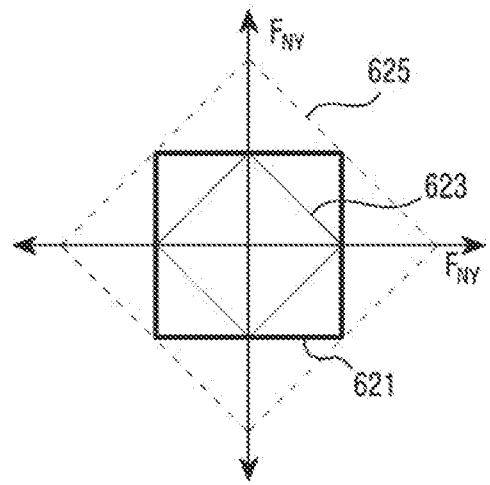

FIG. 6 illustrates a unit pixel 610 and a frequency expression area in a case where a photographing resolution of an electronic device 100 is a first resolution, according to an embodiment. In an embodiment, the first resolution may be 48 Mp (Mega pixel).

Referring to FIG. 6A, in an embodiment, the color filter array 310 may include a plurality of color filters having a first grid pattern (solid line). The plurality of color filters may be implemented in a quadrangular shape.

In an embodiment, the image signal processor 130 may acquire image data via a pixel array having a second grid pattern (dotted line) forming an angle of 45 degrees with respect to the first grid pattern.

In an embodiment, the image sensor 120 may determine a unit pixel 610 in the color filter array 310. The unit pixel 610 may have a shape of a quadrangle circumscribing a green filter of the color filter array 310. The circumscribing quadrangle may be a square. The unit pixels 610 may be repeatedly arranged to correspond to the second grid pattern. The size of the area of the unit pixel 610 may be two times the size of the individual green filter included in the color filter array 310.

In an embodiment, the unit pixel 610 may include a first area corresponding to the green color filter, a second area, a third area, a fourth area, and a fifth area defined by the contact of the green color filter and the unit pixel 610 and corresponding to an exterior of the first area.

In an embodiment, the unit pixel may include one green filter area, a ¼ area of a red filter, and a ¼ area of a blue filter. For example, a ¼ area of a blue filter may be disposed in each of the second area and the fourth area, and a ¼ area of a red filter may be disposed in each of the third area and the fifth area. The opposite may also be possible. This is only an embodiment, and the areas may be configured by a cyan color filter, a yellow color filter, and a magenta color filter.

In an embodiment, the second area and the fourth area may be arranged to face each other with reference to the center of the first area. The third area and the fifth area may be arranged to face each other with reference to the center of the first area.

In an embodiment, the image sensor 120 may perform binning ¼ areas corresponding to the red filters. The image sensor 120 may perform binning ¼ areas corresponding to the blue filters. The binning process may be performed by the image signal processor 130.

In an embodiment, the image sensor 120 may output the binned color values. The image sensor 120 may average the color values of the same color pixels in the unit pixel 610 and output same. The phase of the binned red color and the phase of the binned blue color may be the same as the phase of the green color. The image sensor 120 may output a red color, a blue color, and a green color without phase change of color. The image signal processor 130 may perform image processing on the output image data while omitting the demosaicing process.

In an embodiment, the number of pixels of the image stored in the memory 220 via the image signal processor 130 may be the same as the number of the green filters. For example, in a case where the number of pixels of the image sensor 120 is 96 Mp, an image having about 48 Mp may be stored in the memory 220.

In an embodiment, compared to outputting an image of 48 Mp by the image sensor 120 having 48 Mp through a general Bayer pattern color filter array, it is possible to have a frequency expression range of a twice wider area in a case of outputting an image of the same 48 Mp by the image sensor 120 having 96 Mp, according to an embodiment described in the disclosure.

Referring to (B) of FIG. 6, a frequency expression area 621 of a green color may be ½ of a frequency expression area 625 of all the pixels of the image sensor 120. A frequency expression area 623 of a red color and a blue color may be ¼ of the frequency expression area 625 of all the pixels of the image sensor 120.

Figure 7A:
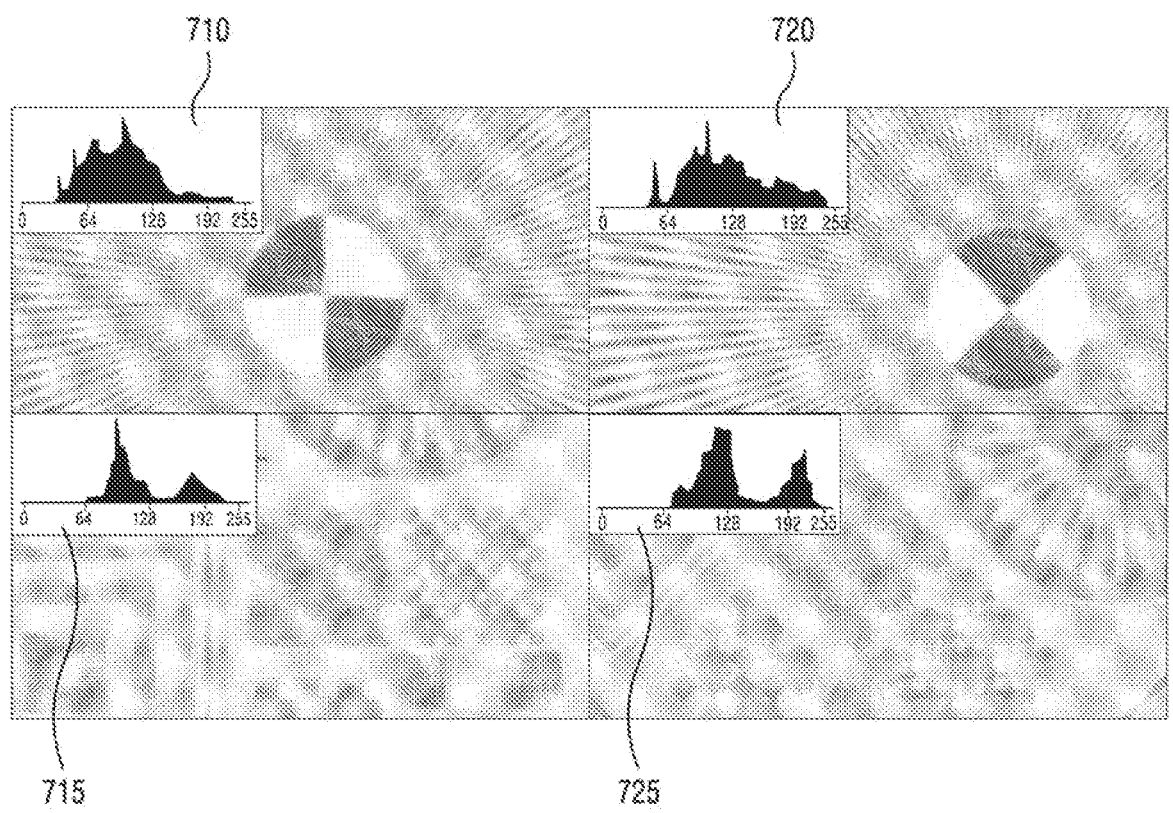
FIG. 7A illustrates a photographed result image in a case where a photographing resolution of an electronic device is the first resolution, according to an embodiment.

FIG. 7A illustrates a photographed result image in a case where a photographing resolution of an electronic device 100 is the first resolution, according to an embodiment. In an embodiment, the first resolution may be 48 Mp.

In an embodiment, a distribution diagram 710 and a distribution diagram 715 show histograms of an image, in a case where the image sensor 120 outputs color values as a Bayer pattern and the image signal processor 130 performs demosaicing of the same by bilinear interpolation.

In an embodiment, a distribution diagram 720 and a distribution diagram 725 show histogram values of an image in a case of photographing based on the embodiment of FIGS. 6 (A and B).

The distribution diagram 720 shows higher RGB values in 128-255, compared with the distribution diagram 710. The distribution diagram 725 shows higher RGB values around 192, compared with the distribution diagram 715. Therefore, in a case of photographing based on the embodiment of FIGS. 6 (A and B), it can be seen that the color expression power and brightness are superior.

Figure 7B:
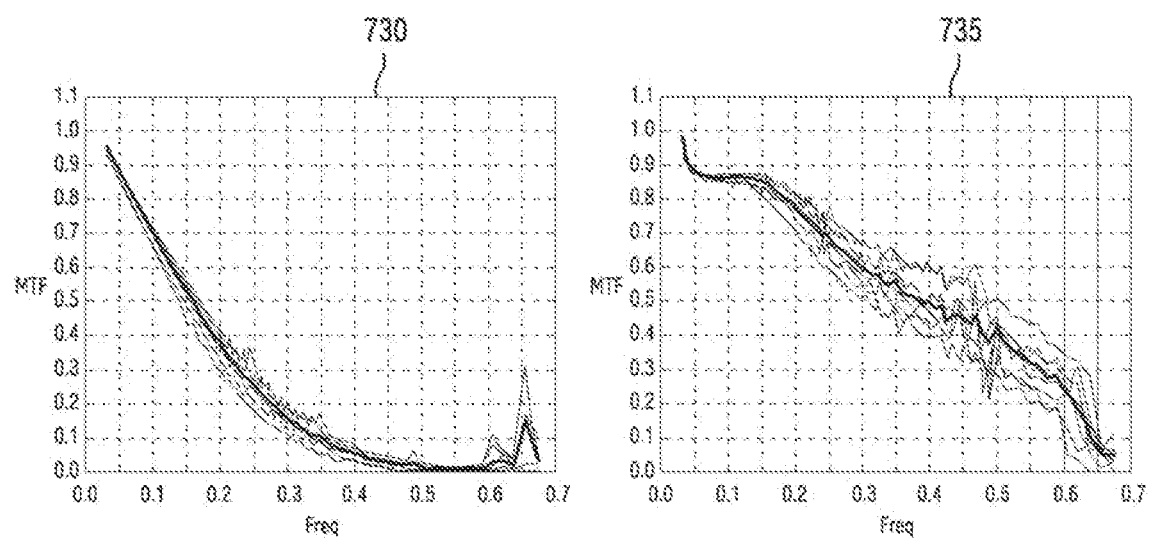
FIG. 7B illustrates a performance graph in a case where a photographing resolution of an electronic device is the first resolution, according to an embodiment.

FIG. 7B illustrates a performance graph in a case where a photographing resolution of an electronic device 100 is the first resolution, according to an embodiment. In an embodiment, the first resolution may be 48 Mp. The performance graph shows a modulation transfer function (MTF) graph which provides both resolution information and contrast information. A horizontal axis of the graph may indicate a frequency, and a vertical axis may indicate an MTF value.

Referring to FIG. 7B, the graph 730 is a performance graph in a case where the image sensor 120 outputs color values as a Bayer pattern and the image signal processor 130 performs demosaicing the same by bilinear interpolation. Graphs 735 are performance graphs in a case of photographing based on the embodiment of FIGS. 6 (A and B).

In an embodiment, a horizontal axis of the graphs illustrated in FIG. 7B may indicate a frequency, and a vertical axis may indicate an MTF value. The graphs are graphs showing how much frequency range can be expressed according to MTF values. For example, the graphs may indicate how many frequencies can be expressed at a point where black and white values differ from each other by about 10% between 0 and 255 if the MTF value is 0.1 (10%).

In an embodiment, the frequency expression range according to an MTF value is wider in the graphs 735 than in the graphs 730. For example, when the MTF value is 0.1 (10%), the graphs 730 may express frequencies of about 0.3517 per pixel, and the graphs 735 may represent frequencies of about 0.6384 per pixel. In other words, it can be seen that when an image is captured based on the embodiment of FIGS. 6 (A and B), the sharpness of the image can be improved.

Figure 8:
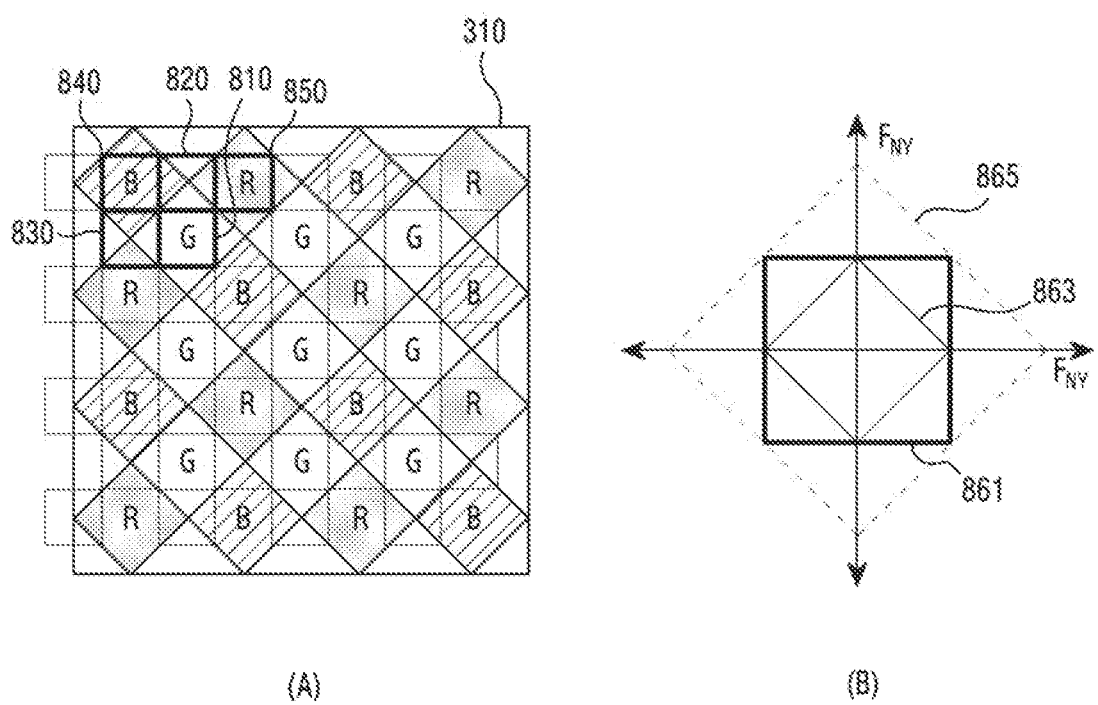
FIGS. 8 (A and B) illustrates a unit pixel and a frequency expression area in a case where a photographing resolution of an electronic device is a second resolution which is four times the first resolution, according to an embodiment.

FIGS. 8 (A and B) illustrates a unit pixel and a frequency expression area in a case where a photographing resolution of an electronic device 100 is a second resolution that is four times the first resolution, according to an embodiment. In an embodiment, the second resolution may be 192 Mp.

Referring to (A) of FIG. 8, in an embodiment, the color filter array 310 may include a plurality of color filters having a first grid pattern (solid line). The plurality of color filters may be implemented in a quadrangular shape.

In an embodiment, the image signal processor 130 may acquire image data via a pixel arrangement having a second grid pattern (thick solid line) forming an angle of 45 degrees with respect to the first grid pattern.

In an embodiment, the image sensor 120 may determine unit pixels 810, 820, and 830 in the color filter array 310. The unit pixel 810 may have a shape of a quadrangle inscribed by an individual color filter. The unit pixels 820 and 830 may be quadrangles excluding the unit pixel 810. The unit pixel 810 may be a square.

The unit pixel 810 may have a shape of a quadrangle inscribed in a green filter of the color filter array 310. The unit pixel 850 may have a shape of a quadrangle inscribed in a red filter. Alternatively, the unit pixel 810 may have a shape of a quadrangle inscribed in a blue filter. The unit pixel 810 may be a square.

The unit pixels 810, 820, and 830 may be repeatedly arranged to correspond to the second grid pattern. The size of the area of the unit pixel 810 may be ½ the size of an individual color filter included in the color filter array 310.

In an embodiment, the unit pixel 810 may include an area corresponding to one green filter. The unit pixel 820 and the unit pixel 830 may include a ½ area corresponding to a green filter, a ¼ area corresponding to a red filter, and a ¼ area corresponding to a blue filter. This is merely an embodiment, and the areas may correspond to a cyan filter, a yellow filter, and a magenta filter.

In an embodiment, the image sensor 120 may output color values to correspond to the second grid pattern (dotted line), not to the first grid pattern (solid line) of the color filter array 310. The image sensor 120 may output color values as a Bayer pattern that has rotated the color filter array 310 by 45 degrees.

In an embodiment, the image sensor 120 may output a green color value via the unit pixel 810 inscribed in an individual color filter.

In an embodiment, the image sensor 120 may perform interpolation using a portion of a blue filter corresponding to the unit pixel 820 through the unit pixel 820. The image sensor 120 may output the blue color value through the unit pixel 820.

In an embodiment, the image sensor 120 may perform interpolation using a portion of a red filter corresponding to the unit pixel 830 through the unit pixel 830. The image sensor 120 may output the red color value through the unit pixel 830.

In an embodiment, the interpolation process may be referred to as a re-Bayer process and may be performed by the image signal processor 130.

In an embodiment, the image signal processor 130 may display an image having twice as many pixels as the number of pixels of the image sensor 120 through the display 110. For example, the image sensor 120 having 96 Mp may output image data of about 192 Mp via the re-Bayer. The re-Bayer may be a rearrangement process to configure a Bayer pattern according to the arrangement of unit pixels and thus output color values. The re-Bayer may be performed by referring to neighboring pixel information to perform interpolation or determining an edge portion in an image and weighting color values to perform interpolation.

In an embodiment, the image signal processor 130 may acquire a green color value through the unit pixel 810. The image signal processor 130 may acquire, through the unit pixel 810, light information absorbed through a green color filter corresponding to the unit pixel 810.

In an embodiment, the image signal processor 130 may acquire a blue color value through the unit pixel 820. The image signal processor 130 may refer to neighboring pixel information or information of an edge of an image to acquire an interpolated blue color value.

In an embodiment, the image signal processor 130 may acquire a red color value through the unit pixel 830. The image signal processor 130 may refer to neighboring pixel information or information of an edge of an image to acquire an interpolated red color value.

In an embodiment, the image signal processor 130 may acquire a green color value through the unit pixel 840. The image signal processor 130 may refer to color values from neighboring green color filters of the unit pixel 840 to acquire a green color value.

In an embodiment, the number of pixels of an image stored in the memory 220 through the image signal processor 130 may be twice the number of the green filters. For example, in a case where the number of pixels of the image sensor 120 is 96 Mp, an image of about 192 Mp may be stored in the memory 220.

Referring to (B) of FIG. 8, a frequency expression area 861 of the green pixels may be ½ of a frequency expression area 865 of all the pixels of the image sensor 120. A frequency expression area 863 of the red pixels and the blue pixels may be ¼ of the frequency expression area 865 of all the pixels of the image sensor 120.

Figure 9:
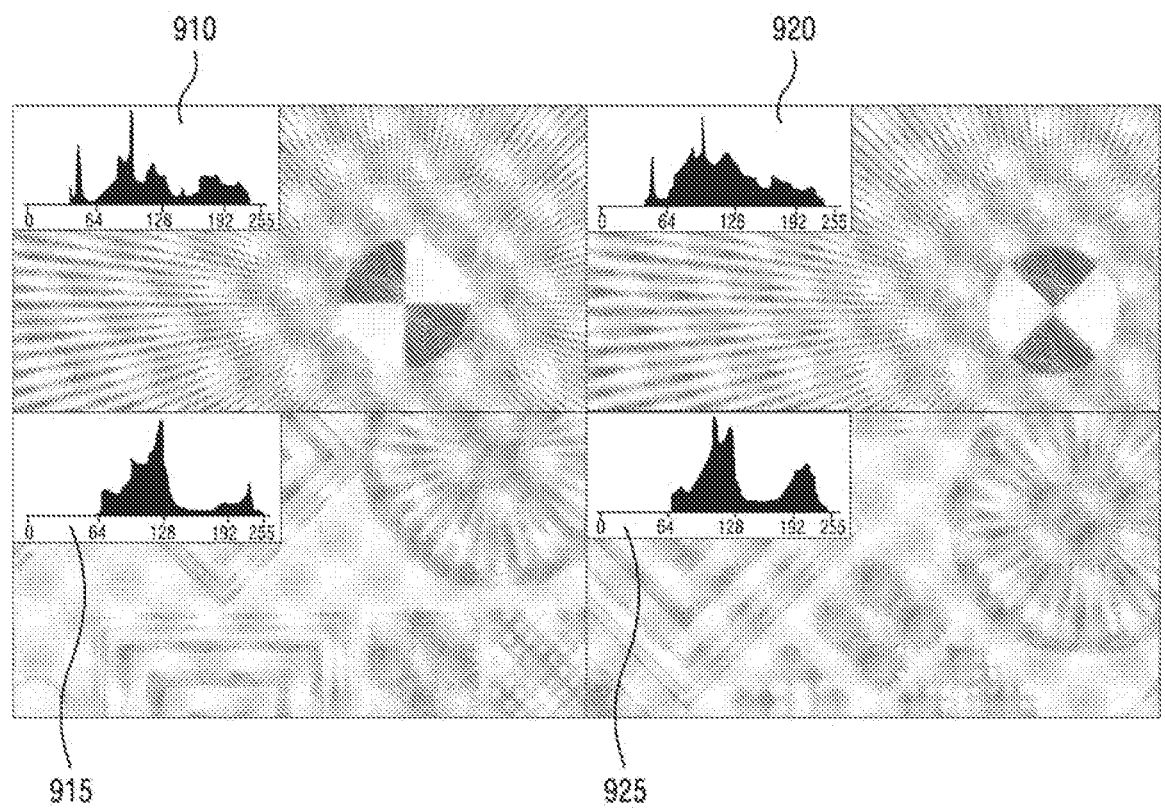
FIG. 9 illustrates a photographed result image in a case where a photographing resolution of an electronic device is the second resolution, according to an embodiment.

FIG. 9 illustrates a photographed result image in a case where a photographing resolution of an electronic device 100 is the second resolution, according to an embodiment. In an embodiment, the second resolution may be 192 Mp.

In an embodiment, a distribution diagram 910 and a distribution diagram 915 show histogram values of an image, in a case where the image sensor 120 outputs color values as a Bayer pattern and then performs photographing. The Bayer pattern may be implemented via interpolation by referring to neighboring pixel information in a tetra pattern.

In an embodiment, a distribution diagram 920 and a distribution diagram 925 show histogram values of an image in a case of photographing based on the embodiment of FIGS. 8 (A and B).

When the distribution diagram 920 is compared with the distribution diagram 910, the RGB values of the former may be greater than or similar to those of the latter as a whole. When the distribution diagram 925 is compared with the distribution diagram 915, the RGB values of the former may be greater than or similar to those of the latter as a whole.

Figure 10:
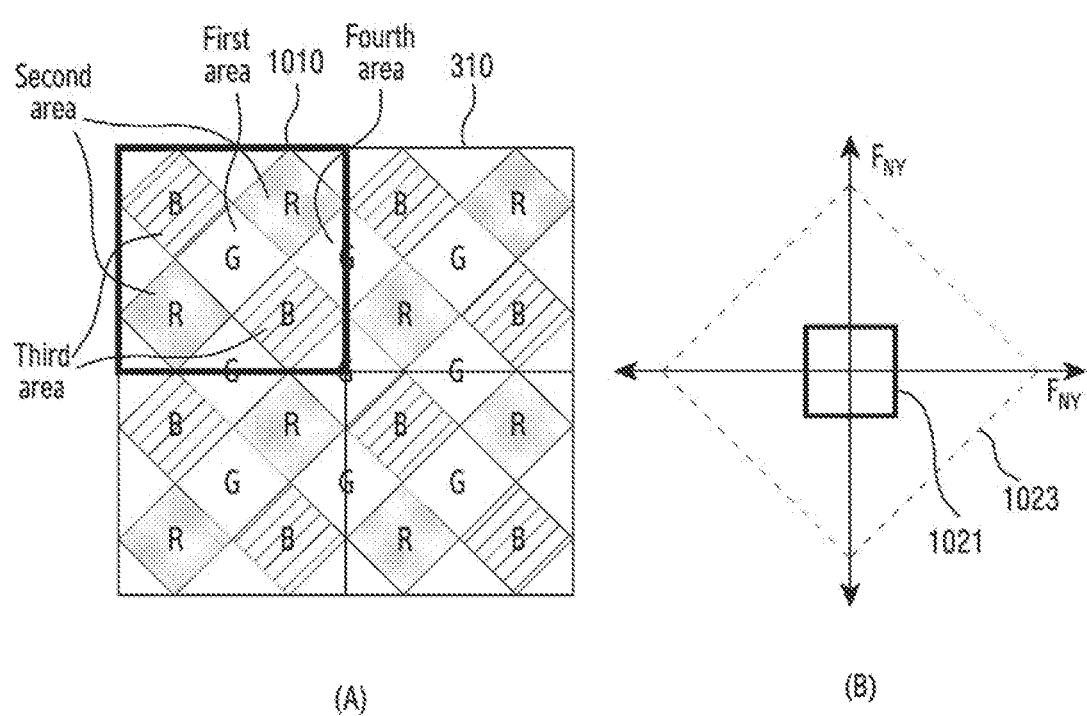
FIGS. 10 (A and B) illustrates a unit pixel and a frequency expression area in a case where a photographing resolution of an electronic device is a third resolution which is a quarter times the first resolution, according to an embodiment.

FIGS. 10 (A and B) illustrates a unit pixel and a frequency expression area in a case where a photographing resolution of an electronic device 100 is a third resolution that is a quarter times the first resolution, according to an embodiment. In an embodiment, the third resolution may be 12 Mp.

In an embodiment, compared with FIGS. 6 (A and B), a unit pixel 1010 in FIGS. 10 (A and B) may have an increased area. The area of the unit pixel 1010 is not limited thereto, and may be further increased as long as there is no phase change of color.

Referring to A of FIG. 10, in an embodiment, the color filter array 310 may include a plurality of color filters having a first grid pattern (solid line). The plurality of color filters may be implemented in a quadrangular shape.

In an embodiment, the image signal processor 130 may acquire image data via a pixel arrangement having a second grid pattern (thick solid line) forming an angle of 45 degrees with respect to the first grid pattern.

In an embodiment, the image sensor 120 may determine the unit pixel 1010 in the color filter array 310. The unit pixel 1010 may have a shape of a quadrangle circumscribing four individual pixels surrounding a green filter of the color filter array. The unit pixels 1010 may be repeatedly arranged to correspond to the second grid pattern. The size of the area of the unit pixel 1010 may be eight times the size of the individual green filter included in the color filter array 310. In an embodiment, the unit pixel 1010 may include twice the area of a green filter, four times the area of a blue filter, and four times the area of a red filter.

In an embodiment, the unit pixel 1010 may include a first area corresponding to one green color filter, a second area corresponding to two red color filters, a third area corresponding to two blue color filters, and a fourth area defined by the contact of the red color filters and the blue color filters and the unit pixel 1010 and corresponding to an exterior of the first area, the second area, and the third area. The fourth area may correspond to portions of green color filters.

In an embodiment, the image sensor 120 may perform binning the areas corresponding to the red filters. The image sensor 120 may perform binning the areas corresponding to the blue filters. The binning process may also be performed by the image signal processor 130.

In an embodiment, the image sensor 120 may output the binned color values. The image sensor 120 may average the color values of the same color pixels in the unit pixel 1010 and output same. The phase of the binned red color and the phase of the binned blue color may be the same as the phase of the green color. The image sensor 120 may output a red color, a blue color, and a green color without phase change of color. The image signal processor 130 may perform image processing on the output image data while omitting the demosaicing process.

In an embodiment, the number of pixels of an image stored in the memory 220 through the image signal processor 130 may be ¼ times the number of the green filters. For example, in a case where the number of pixels of the image sensor 120 is 96 Mp, an image of about 12 Mp may be stored in the memory 220.

Referring to B of FIG. 10, a frequency expression area 1021 of the green pixels, the red pixels, and the blue pixels may be ⅛ of a frequency expression area 1023 of all the pixels of the image sensor 120.

Figure 11:
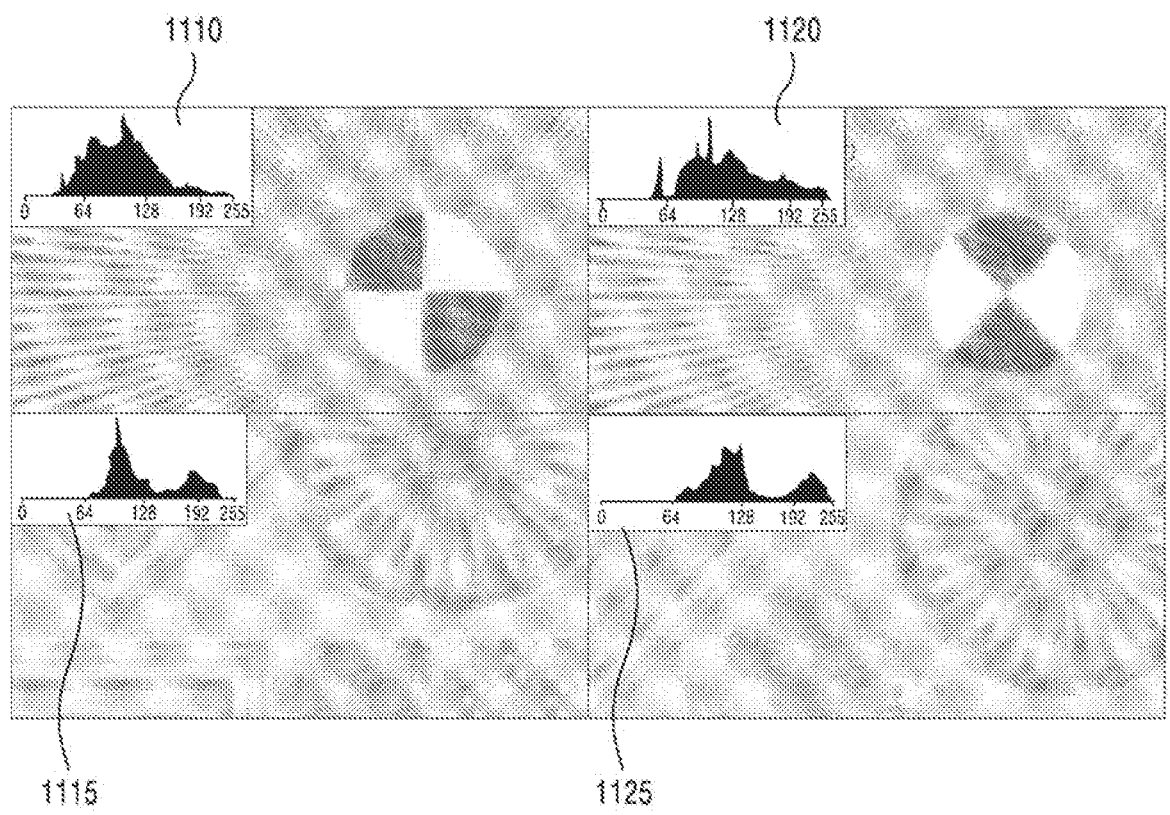
FIG. 11 illustrates a photographed result image in a case where a photographing resolution of an electronic device is the third resolution, according to an embodiment.

FIG. 11 illustrates a photographed result image in a case where a photographing resolution of an electronic device 100 is the third resolution, according to an embodiment. In an embodiment, the third resolution may be 12 Mp.

In an embodiment, a distribution diagram 1100 and a distribution diagram 1115 show histogram values of an image in a case of photographing without a color phase shift in a tetra pixel structure.

In an embodiment, a distribution diagram 1120 and a distribution diagram 1125 show histogram values of an image in a case of photographing based on the embodiment of FIGS. 10 (A and B).

When the distribution diagram 1120 is compared with the distribution diagram 1110, it can be seen that the intensity of the RGB values of the former is similar to that of the latter as a whole. When the distribution diagram 1125 is compared with the distribution diagram 1115, it can be seen that the intensity of the RGB values of the former is similar to that of the latter as a whole.

Figure 12:
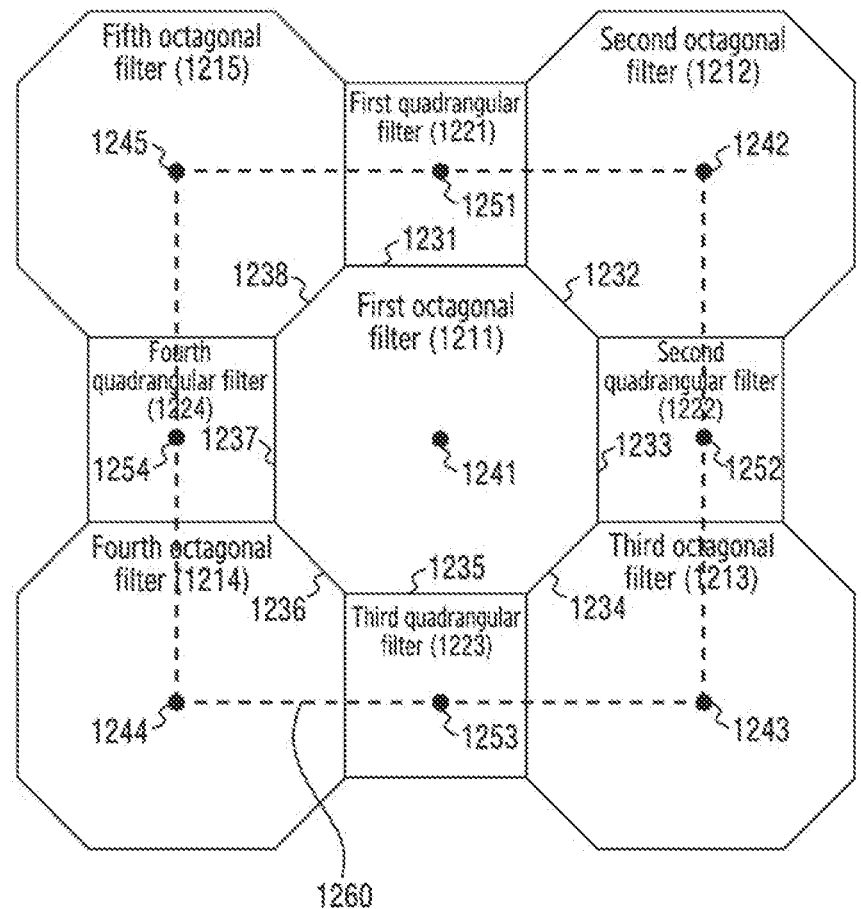
FIG. 12 illustrates shapes and an arrangement of color filters according to an embodiment.
Figure 12:
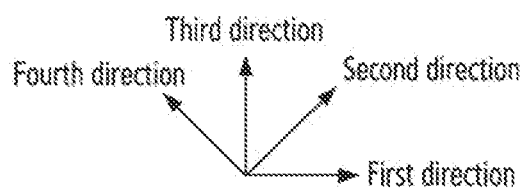

FIG. 12 illustrates shapes and an arrangement of color filters according to an embodiment. The shapes and arrangement of the color filters described in FIG. 12 may be applied in FIG. 13 to FIG. 16. Hereinafter, embodiments shown in FIG. 13, FIG. 14, and FIG. 16 may show that the saturation of the pixels has been changed by changing the structure and arrangement of the color filters.

In an embodiment, the color filter array 310 (included in the image sensor 120) may include color filters having different sizes. For example, the image sensor 120 may include a small pixel having low sensitivity and a large pixel having high sensitivity, the small pixel and the large pixel having different sensitivities according to the sizes thereof. The pixel having low sensitivity may perform color saturation later than the large pixel having high sensitivity. The small pixel having low sensitivity may be a pixel corresponding to a quadrangular color filter, and the large pixel having high sensitivity may be a pixel corresponding to an octagonal color filter. In a case where the speed of saturation for a color becomes slow, a dynamic range (DR) may become wider. In a case where the DR increases, the electronic device 100 may acquire an image in which a wider range of colors is expressed from a dark place to a bright place.

In an embodiment, the color filter array 310 may include a first octagonal filter 1211 to a fifth octagonal filter 1215. The color filter array 310 may also include a first quadrangular filter 1221 to a fourth quadrangular filter 1224. The first octagonal filter 1211 to the fifth octagonal filter 1215, and the first quadrangular filter 1221 to the fourth quadrangular filter 1224 may refer to color filters. The colors may be RGB, RGBW, CYM, or CYMK.

In an embodiment, the first octagonal filter 1211 may include a first edge 1231 having a first length, a second edge 1232 having the first length, a third edge 1233 having the first length, a fourth edge 1234 having the first length, a first edge 1231 having a second length, a second edge 1232 having the second length, a third edge 1233 having the second length, and a fourth edge 1234 having the second length. The first length may have the same length as the second length. The first length may be longer than the second length. For example, the first length may be about 0.7 um, and the second length may be about 0.416 um. On the contrary, the first length may be shorter than the second length.

In an embodiment, the second octagonal filter 1212 may share the first edge 1231 with the first octagonal filter 1211. The third octagonal filter 1213 may share the second edge 1232 with the first octagonal filter 1211. The fourth octagonal filter 1214 may share the third edge 1233 with the first octagonal filter 1211. The fifth octagonal filter 1215 may share the fourth edge 1234 with the first octagonal filter 1211. The first quadrangular filter 1221 may share the first edge 1231 with the first octagonal filter 1211. The second quadrangular filter 1222 may share the second edge 1232 with the first octagonal filter 1211. The third quadrangular filter 1223 may share the third edge 1233 with the first octagonal filter 1211.

In an embodiment, the second octagonal filter 1212 may be positioned in a diagonal direction (e.g., a second direction) with respect to the first octagonal filter 1211. The second octagonal filter 1212 may be provided to be in contact with the first octagonal filter 1211. The diagonal direction (e.g., the second direction) may refer to a direction oriented from the center 1241 of the first octagonal filter 1211 to the center 1242 of the second octagonal filter 1212.

In an embodiment, the third octagonal filter 1213 may be positioned in a diagonal direction (e.g., a direction opposite to a fourth direction) with respect to the first octagonal filter 1211. The third octagonal filter 1213 may be provided to be in contact with the first octagonal filter 1211. The diagonal direction (e.g., a direction opposite to the fourth direction) may refer to a direction oriented from the center 1241 of the first octagonal filter 1211 to the center 1243 of the third octagonal filter 1213.

In an embodiment, the fourth octagonal filter 1214 may be positioned in a diagonal direction (e.g., a direction opposite to the second direction) with respect to the first octagonal filter 1211. The fourth octagonal filter 1214 may be provided to be in contact with the first octagonal filter 1211. The diagonal direction (e.g., a direction opposite to the second direction) may refer to a direction oriented from the center 1241 of the first octagonal filter 1211 to the center 1244 of the fourth octagonal filter 1214.

In an embodiment, the fifth octagonal filter 1215 may be positioned in a diagonal direction (e.g., the fourth direction) with respect to the first octagonal filter 1211. The fifth octagonal filter 1215 may be provided to be in contact with the first octagonal filter 1211. The diagonal direction (e.g., the fourth direction) may refer to a direction oriented from the center 1241 of the first octagonal filter 1211 to the center 1245 of the fifth octagonal filter 1215.

In an embodiment, the first quadrangular filter 1221 may be positioned in a vertical direction (e.g., a third direction) with respect to the first octagonal filter 1211. The first quadrangular filter 1221 may be provided to be in contact with the first octagonal filter 1211. The vertical direction (e.g., the third direction) may refer to a direction oriented from the center 1241 of the first octagonal filter 1211 to the center 1251 of the first quadrangular filter 1221.

In an embodiment, the second quadrangular filter 1222 may be positioned in a horizontal direction (e.g., a first direction) with respect to the first octagonal filter 1211. The second quadrangular filter 1222 may be provided to be in contact with the first octagonal filter 1211. The horizontal direction (e.g., the first direction) may refer to a direction oriented from the center 1241 of the first octagonal filter 1211 to the center 1252 of the second quadrangular filter 1222.

In an embodiment, the third quadrangular filter 1223 may be positioned in a vertical direction (e.g., a direction opposite to the third direction) with respect to the first octagonal filter 1211. The third quadrangular filter 1223 may be provided to be in contact with the first octagonal filter 1211. The vertical direction (e.g., a direction opposite to the third direction) may refer to a direction oriented from the center 1241 of the first octagonal filter 1211 to the center 1253 of the third quadrangular filter 1223.

In an embodiment, the fourth quadrangular filter 1224 may be positioned in a horizontal direction (e.g., a direction opposite to the first direction) with respect to the first octagonal filter 1211. The fourth quadrangular filter 1224 may be provided to be in contact with the first octagonal filter 1211. The horizontal direction (e.g., a direction opposite to the first direction) may refer to a direction oriented from the center 1241 of the first octagonal filter 1211 to the center 1254 of the fourth quadrangular filter 1224.

In an embodiment, a unit pixel 1260, in which the center 1242 of the second octagonal filter 1212, the center 1243 of the third octagonal filter 1213, the center 1244 of the fourth octagonal filter 1214, and the center 1245 of the fifth octagonal filter 1215 are connected, may be configured. The unit pixel 1260 may include the first octagonal filter 1211. The unit pixel 1260 may include ½ portions of the first quadrangular filter 1221 to the fourth quadrangular filter 1224. The unit pixel 1260 may include ¼ portions of the second octagonal filter 1212 to the fifth octagonal filter 1215. The border of the unit pixel 1260 may overlap the center 1251 of the first quadrangular filter 1221, the center 1252 of the second quadrangular filter 1222, the center 1253 of the third quadrangular filter 1223, and the center 1254 of the fourth quadrangular filter 1224.

In an embodiment, the contents of FIG. 8 may be applied to the unit pixel 1260. The unit pixel 1260 may be configured as a quadrangle inscribed in octagonal filters. For example, the unit pixel 1260 may be defined as a quadrangle configured by connecting the center point of the first edge 1231, the center point of the second edge 1232, the center point of the third edge 1233, and the center point of the fourth edge 1234.

In an embodiment, the contents of FIGS. 10 (A and B) may be applied to the unit pixel 1260. The unit pixel 1260 may be configured as a quadrangle circumscribing multiple quadrangular color filters and multiple octagonal color filters.

In an embodiment, the first octagonal filter 1211, the second octagonal filter 1212, the third octagonal filter 1213, the fourth octagonal filter 1214, and the fifth octagonal filter 1215 may be green color filters. The second quadrangular filter 1222 and the fourth quadrangular filter 1224 may be red color filters. The first quadrangular filter 1221 and the third quadrangular filter 1223 may be blue color filters. This may be applied to FIG. 13.

In an embodiment, the first octagonal filter 1211, the first quadrangular filter 1221, the second quadrangular filter 1222, the third quadrangular filter 1223, and the fourth quadrangular filter 1224 may be green color filters. The second octagonal filter 1212 and the fourth octagonal filter 1214 may be blue color filters. The third octagonal filter and the fifth octagonal filter 1215 may be red color filters. This may be applied to FIG. 14.

In an embodiment, the first octagonal filter 1211, the second quadrangular filter 1222, and the fourth quadrangular filter 1224 may be green color filters. The third quadrangular filter 1223, the third octagonal filter 1213, and the fifth octagonal filter 1215 may be red color filters. The first quadrangular filter 1221, the second octagonal filter 1212, and the fourth octagonal filter 1214 may be blue color filters. This may be applied to FIG. 16.

In an embodiment, by arranging quadrangular color filters between octagonal color filters as shown in FIG. 12, the electronic device 100 may acquire a high dynamic range (HDR) image having an expanded DR. In other words, an image can be expressed in a wider range of brightness from dark to bright, at the time of shooting the image.

Figure 13:
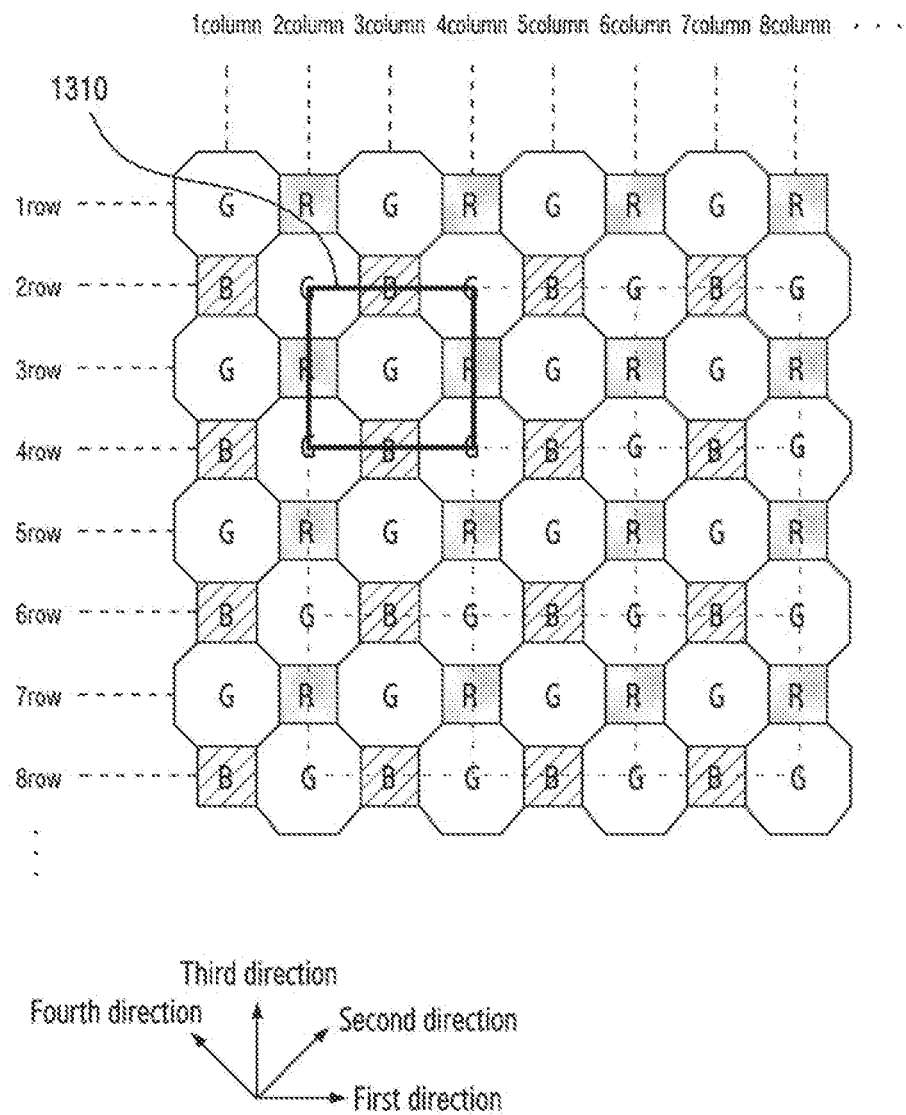
FIG. 13 illustrates a first color filter array according to an embodiment.

FIG. 13 illustrates a color filter array 310 according to an embodiment. The descriptions in FIG. 12 may be applied to FIG. 13. The unit pixel 1310 of FIG. 13 may correspond to the unit pixel 1260 of FIG. 12. A first row and a first column described in FIG. 13 may be at least one edge of the color filter array.

In an embodiment, the octagonal color filters may be green color filters. Referring to FIG. 13, the octagonal color filters may be arranged in odd-numbered rows×odd-numbered columns and in even-numbered rows×even-numbered columns. For example, the octagonal color filters may be arranged in 1×1, 3×5, 4×8, etc.

In an embodiment, a portion of quadrangular color filters may be red color filters. The quadrangular color filters arranged in odd-numbered rows×even-numbered columns may be red color filters. For example, the red color filters may be arranged in 1×2, 1×6, 7×2, etc.

In an embodiment, a portion of quadrangular color filters may be blue color filters. The quadrangular color filters arranged in even-numbered rows×odd-numbered columns may be blue color filters. For example, the blue color filters may be arranged in 2×5, 4×1, 6×3, etc.

In an embodiment, the unit pixel 1310 may include an octagonal green color filter in the center thereof. The unit pixel 1310 may include portions of octagonal green color filters in diagonal directions (e.g., a second direction, a direction opposite to the second direction, a fourth direction, and a direction opposite to the fourth direction) with reference to the center of the unit pixel 1310. The unit pixel 1310 may include portions of quadrangular red color filters in a horizontal direction (e.g., a first direction and a direction opposite to the first direction) with reference to the center of the unit pixel 1310. The unit pixel 1310 may include portions of quadrangular blue color filters in a vertical direction (e.g., a third direction and a direction opposite to the third direction) with reference to the unit pixel 1310.

In an embodiment, the unit pixel 1310 may configure a grid pattern and be repeatedly arranged as illustrated in FIG. 13. The image sensor 120 may output color values corresponding to the unit pixel 1310. The image signal processor 130 may acquire the color values corresponding to the unit pixel 1310 to perform image processing.

In an embodiment, arranging the quadrangular color filters between the octagonal color filters as shown in FIG. 13 may allow the green color filters having high sensitivity to occupy an area of a plurality of image sensors, thereby increasing the sensitivity of the image sensor 120.

Figure 14:
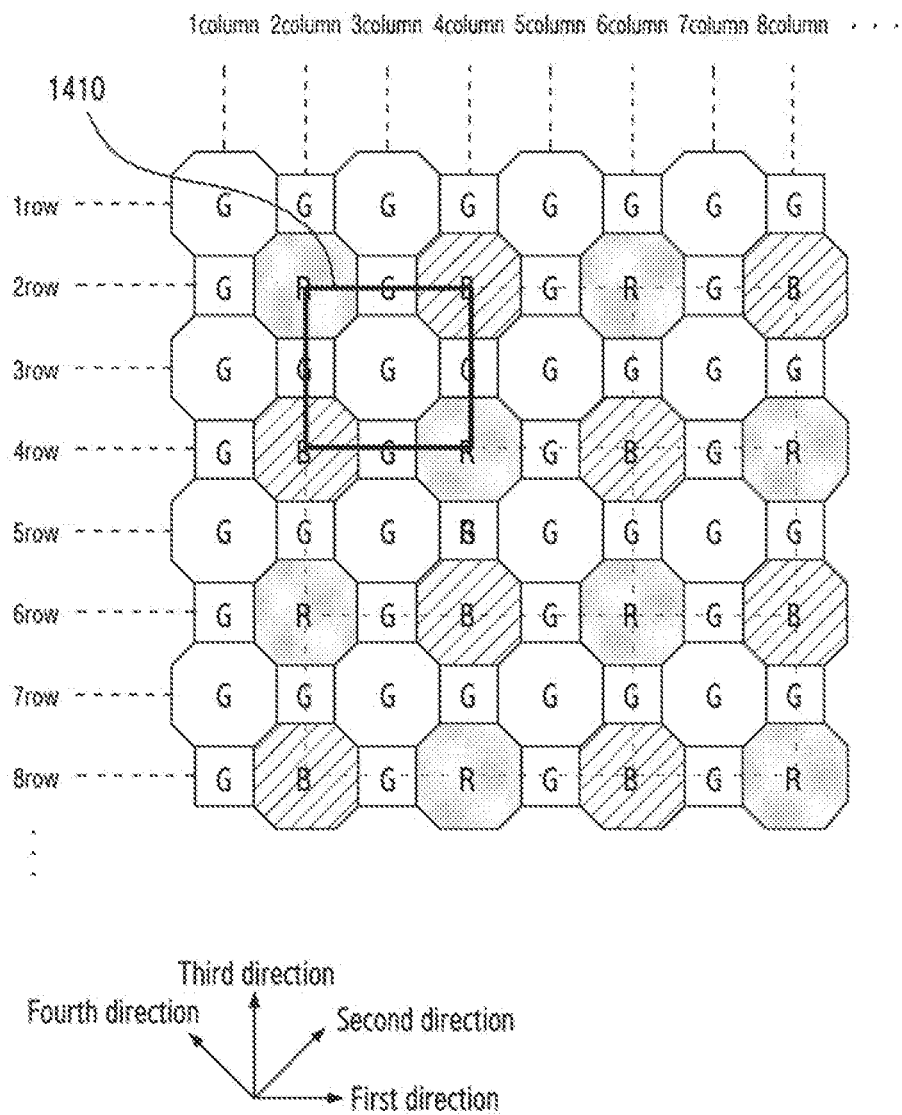
FIG. 14 illustrates a second color filter array according to an embodiment.

FIG. 14 illustrates a color filter array 310 according to an embodiment. The descriptions in FIG. 12 may be applied to FIG. 14. The unit pixel 1410 of FIG. 14 may correspond to the unit pixel 1260 of FIG. 12. A first row and a first column described in FIG. 14 may be at least one edge of the color filter array.

In an embodiment, color filters arranged in odd-numbered rows or odd-numbered columns may be green color filters. The green color filters may have an octagonal shape or a quadrangular shape. The octagonal green color filters may be arranged in odd-numbered rows×odd-numbered columns. For example, the octagonal green color filters may be arranged in 1×3, 3×7, 5×3, etc. The quadrangular green filters may be arranged in odd-numbered rows×even-numbered columns and/or even-numbered rows×odd-numbered columns.

In an embodiment, the octagonal color filters arranged in even-numbered rows may be red color filters or blue color filters. The octagonal color filters arranged in even-numbered rows may be arranged to allow a red color filter and a blue color filter to be alternately and repeatedly arranged one by one. For example, red color filter may be arranged in 2×3, 2×6, and 2×10, and blue color filters may be arranged in 2×4, 2×8, and 2×12. The red color filters and the blue color filters may be arranged on the color filter array in a checker board shape.

In an embodiment, the unit pixel 1410 may include an octagonal green color filter in the center thereof. The unit pixel 1410 may include portions of octagonal green color filters ("G") in diagonal directions (e.g., a second direction, a direction opposite to the second direction, a fourth direction, and a direction opposite to the fourth direction) with reference to the center of the unit pixel 1410. The unit pixel 1410 may include portions of octagonal red color filters ("R") in a horizontal direction (e.g., a first direction and a direction opposite to the first direction) with reference to the center of the unit pixel 1410. The unit pixel 1410 may include portions of octagonal blue color filters ("B") in a vertical direction (e.g., a third direction and a direction opposite to the third direction) with reference to the center of the unit pixel 1410.

In an embodiment, the unit pixel 1410 may configure a grid pattern and be repeatedly arranged as illustrated in FIG. 14. The image sensor 120 may output color values corresponding to the unit pixel 1410. The image signal processor 130 may acquire the color values corresponding to the unit pixel 1410 to perform image processing.

Figure 15:
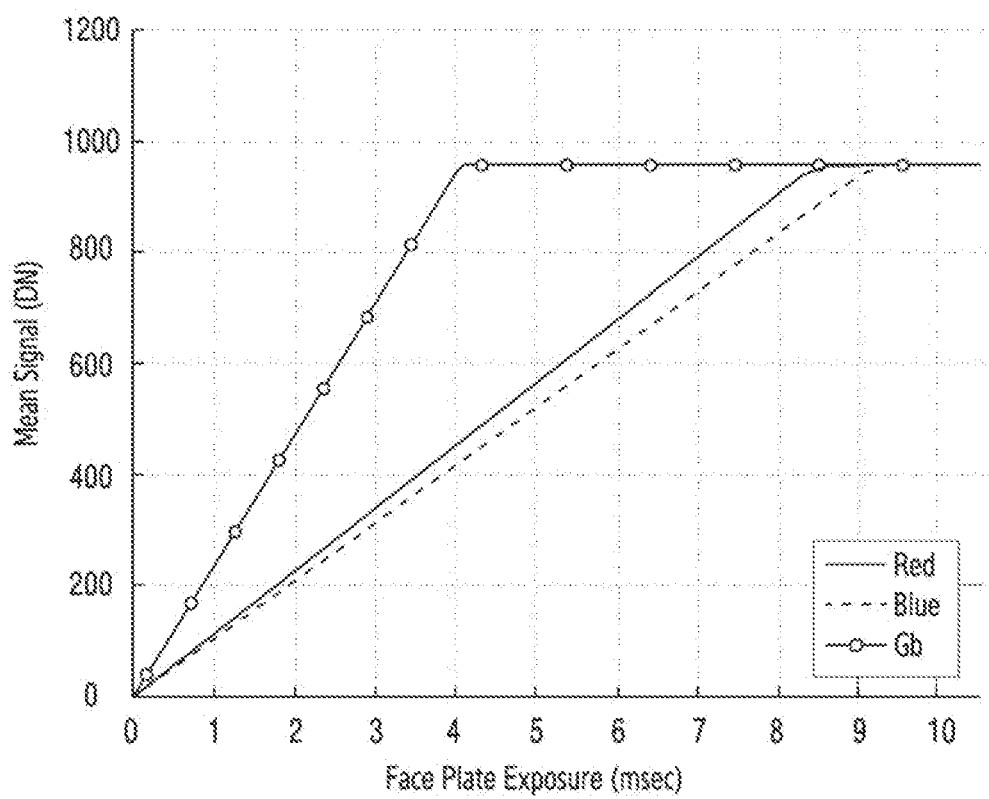
FIG. 15 illustrates saturations of R, G, and B color values over time in a case where a color filter array is configured as a Bayer pattern in an electronic device according to an embodiment.

FIG. 15 is a view illustrating saturations of R, G, and B color values over time in a case where a color filter array 310 is configured as a Bayer pattern in an electronic device 100 according to an embodiment.

Referring to FIG. 15, the image sensor 120 may receive light information, and acquire color values through the color filter array 310. Pixels included in the image sensor 120 may have different color saturations according to color values. For example, a green color value may be saturated in 4 m sec after a pixel has received light information. A red color value may be saturated in 8.5 m sec after a pixel has received light information. A blue color value may be saturated in 9 m sec after a pixel has received light information.

In an embodiment, the pixels cannot output color values in a case where a predetermined time has elapsed after receiving light information through the color filters. For example, the pixels cannot express the green color values in a case where 4 m sec have elapsed after receiving light information through the color filters. The pixels cannot express the red color values in a case where 8.5 m sec have elapsed after receiving light information through the color filters. The pixels cannot express the blue color values in a case where 9 m sec have elapsed after receiving light information through the color filters.

In an embodiment, the saturation time for each color may be different according to a photographing environment. For example, a red color may be saturated faster than other colors in a case of photographing in red lighting.

In an embodiment, color distortion may occur in a case where the saturation time for each color is different. For example, at 5 m sec on the time axis of FIG. 15, a green color may be already saturated and red and blue colors may not be saturated yet. In a case of photographing the sky and forest, color reproducibility increases when RGB colors are expressed, but expression of the green color is incomplete, and thus color reproducibility may decrease.

In an embodiment, the graph of FIG. 15 may be referred in describing FIG. 14. In FIG. 14, the quadrangular green color filter is smaller than the octagonal green color filter and thus may require longer time to reach saturation of color. Therefore, the image signal processor 130 map perform HDR processing by using light that has passed through the red and blue color filters together with the light that has passed through the quadrangular green color filters that have not yet been saturated.

Figure 16:
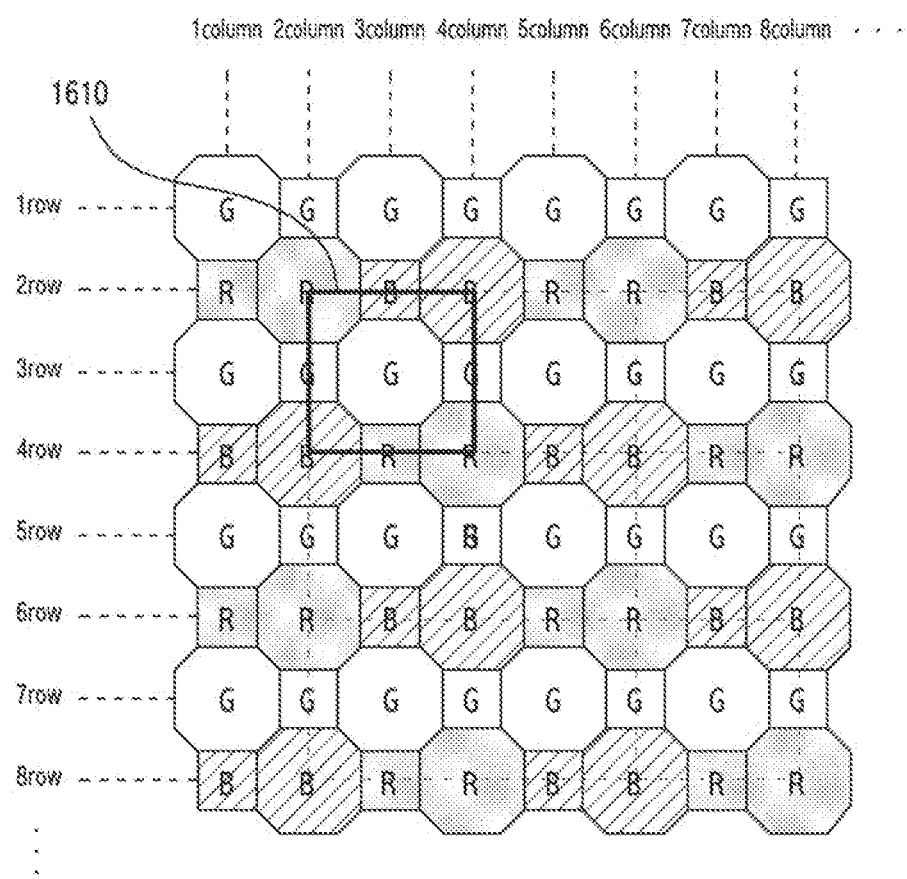
FIG. 16 illustrates a color filter array according to an embodiment.
Figure 16:
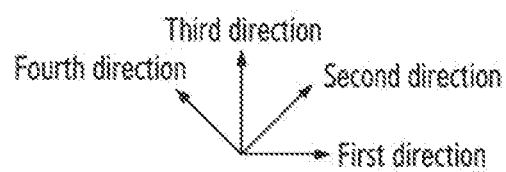

FIG. 16 illustrates a color filter array 310 according to an embodiment. The descriptions in FIG. 13 may be applied to FIG. 16. The unit pixel 1610 of FIG. 16 may correspond to the unit pixel 1360 of FIG. 13. A first row and a first column described in FIG. 16 may be at least one edge of the color filter array.

In an embodiment, color filters arranged in odd-numbered rows may be green color filters. Color filters arranged in even-numbered rows may be blue or red color filters.

In an embodiment, the green color filters arranged in odd-numbered rows may include quadrangular color filters and octagonal color filters. The octagonal color filters and the quadrangular color filters arranged in odd-numbered rows may be alternately and repeatedly arranged one by one. For example, as illustrated in FIG. 16, the octagonal color filters and the quadrangular color filters may be repeatedly arranged such that an octagonal color filter is disposed in a first row and a first column, a quadrangular color filter is disposed in a first row and a second column, an octagonal color filter is disposed in a first row and a third column, a quadrangular color filter is disposed in a first row and a fourth column, and so on. Such a pattern may be equally applied to the odd-numbered rows such as a third row, a fifth row, a seventh row.

In an embodiment, one quadrangular red color filter disposed in an even-numbered row and one octagonal red color filter being in contact with the quadrangular red color filter in a horizontal direction (e.g., a first direction) of the red color filter may configure a first set. One quadrangular blue color filter disposed in an even-numbered row and one octagonal blue color filter being in contact with the quadrangular blue color filter in a horizontal direction (e.g., a first direction) of the blue color filter may configure a second set.

In an embodiment, the first set and the second set may be alternately and repeatedly arranged one by one. For example, as illustrated in FIG. 16, the first set and the second set may be arranged in a horizontal direction (e.g., a first direction) like [a first set, a second set, a first set, a second set, and so on]. The first set and the second set may be arranged on the color filter array in a checker board shape.

In an embodiment, the unit pixel 1610 may include an octagonal green color filter in the center thereof. The unit pixel 1610 may include portions of red color filters in a diagonal direction (e.g., a fourth direction and a direction opposite to the fourth direction) with reference to the center of the unit pixel 1610. The unit pixel 1610 may include portions of blue color filters in a diagonal direction (e.g., a second direction and a direction opposite to the second direction) with reference to the center of the unit pixel 1610. The unit pixel 1610 may include portions of green color filters in a horizontal direction (e.g., a first direction and a direction opposite to the first direction) with reference to the center of the unit pixel 1610. The unit pixel 1610 may include a portion of a blue color filter in a vertical direction (e.g., a third direction) with reference to the center of the unit pixel 1610. The unit pixel 1610 may include a portion of a red color filter in a vertical direction (e.g., a direction opposite to the third direction).

In an embodiment, the unit pixel 1610 may configure a grid pattern and be repeatedly arranged as illustrated in FIG. 16. The image sensor 120 may output color values corresponding to the unit pixel 1610. The image signal processor 130 may acquire the color values corresponding to the unit pixel 1610 to perform image processing.

In an embodiment, referring to FIG. 16, with respect to the green color filters, the red color filters, and the blue color filters, the image sensor 120 includes both a small color filter (e.g., a quadrangular color filter) and a large color filter (e.g., an octagonal color filter) for each color, and thus can express a wider range of colors from a bright part to a dark part. In other words, according to an embodiment like FIG. 16, the image signal processor 130 may perform HDR processing.

Figure 17:
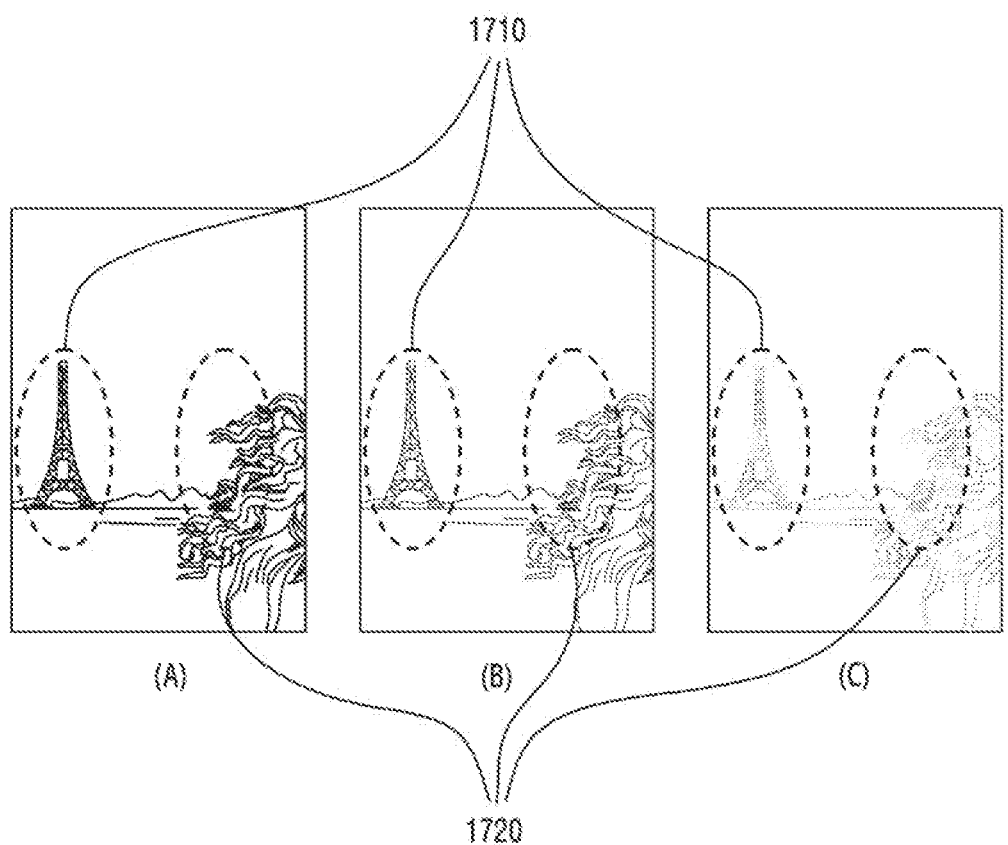
FIG. 17 illustrates images (A, B, C) photographed based on one or more embodiments.

FIG. 17 illustrates images (A, B, C) photographed based on one or more embodiments. (A) of FIG. 17 may be an image photographed based on an embodiment of FIG. 16. (B) of FIG. 17 may be an image photographed based on an embodiment of FIG. 14. (C) of FIG. 17 may be an image photographed based on a color filter array of a Bayer pattern, not a color filter array including octagonal color filters.

Referring to FIG. 17, the color expression for a bright part and a dark part may be performed more clearly in (A) and (B) than in (C). The color expression for a bright part and a dark part may be performed more clearly in (A) than in (B). For example, a power-transmission tower 1710 and hair 1720 may be clearly viewed under the bright sky in (A) of FIG. 17. On the contrary, the power-transmission tower 1710 and the hair 1720 may not be clearly viewed under the bright sky in (C) of FIG. 17.

Figure 18:
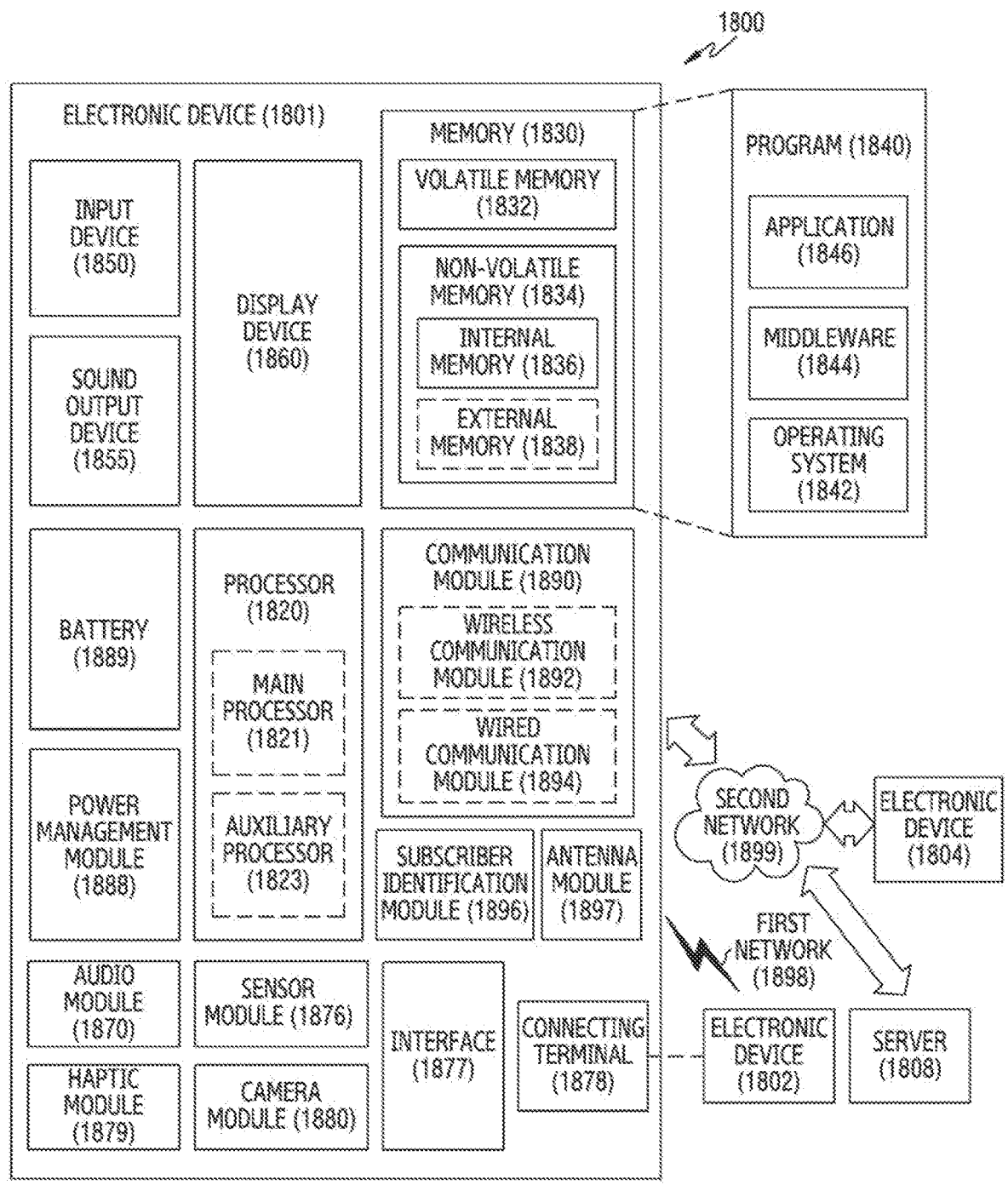
FIG. 18 illustrates an electronic device in a network environment according to one or more embodiments.

FIG. 18 is a block diagram illustrating an electronic device 1801 in a network environment 1800 according to one or more embodiments.

Referring to FIG. 18, the electronic device 1801 in the network environment 1800 may communicate with an electronic device 1802 via a first network 1898 (e.g., a short-range wireless communication network), or at least one of an electronic device 1804 or a server 1808 via a second network 1899 (e.g., a long-range wireless communication network). According to an embodiment, the electronic device 1801 may communicate with the electronic device 1804 via the server 1808. According to an embodiment, the electronic device 1801 may include a processor 1820, memory 1830, an input module 1850, a sound output module 1855, a display module 1860, an audio module 1870, a sensor module 1876, an interface 1877, a connecting terminal 1878, a haptic module 1879, a camera module 1880, a power management module 1888, a battery 1889, a communication module 1890, a subscriber identification module (SIM) 1896, or an antenna module 1897. In some embodiments, at least one of the components (e.g., the connecting terminal 1878) may be omitted from the electronic device 1801, or one or more other components may be added in the electronic device 1801. In some embodiments, some of the components (e.g., the sensor module 1876, the camera module 1880, or the antenna module 1897) may be implemented as a single component (e.g., the display module 1860).

The processor 1820 may execute, for example, software (e.g., a program 1840) to control at least one other component (e.g., a hardware or software component) of the electronic device 1801 coupled with the processor 1820, and may perform various data processing or computation. According to one embodiment, as at least part of the data processing or computation, the processor 1820 may store a command or data received from another component (e.g., the sensor module 1876 or the communication module 1890) in volatile memory 1832, process the command or the data stored in the volatile memory 1832, and store resulting data in non-volatile memory 1834. According to an embodiment, the processor 1820 may include a main processor 1821 (e.g., a central processing unit (CPU) or an application processor (AP)), or an auxiliary processor 1823 (e.g., a graphics processing unit (GPU), a neural processing unit (NPU), an image signal processor (ISP), a sensor hub processor, or a communication processor (CP)) that is operable independently from, or in conjunction with, the main processor 1821. For example, when the electronic device 1801 includes the main processor 1821 and the auxiliary processor 1823, the auxiliary processor 1823 may be adapted to consume less power than the main processor 1821, or to be specific to a specified function. The auxiliary processor 1823 may be implemented as separate from, or as part of the main processor 1821.

The auxiliary processor 1823 may control at least some of functions or states related to at least one component (e.g., the display module 1860, the sensor module 1876, or the communication module 1890) among the components of the electronic device 1801, instead of the main processor 1821 while the main processor 1821 is in an inactive (e.g., sleep) state, or together with the main processor 1821 while the main processor 1821 is in an active state (e.g., executing an application). According to an embodiment, the auxiliary processor 1823 (e.g., an image signal processor or a communication processor) may be implemented as part of another component (e.g., the camera module 1880 or the communication module 1890) functionally related to the auxiliary processor 1823. According to an embodiment, the auxiliary processor 1823 (e.g., the neural processing unit) may include a hardware structure specified for artificial intelligence model processing. An artificial intelligence model may be generated by machine learning. Such learning may be performed, e.g., by the electronic device 1801 where the artificial intelligence is performed or via a separate server (e.g., the server 1808). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 1830 may store various data used by at least one component (e.g., the processor 1820 or the sensor module 1876) of the electronic device 1801. The various data may include, for example, software (e.g., the program 1840) and input data or output data for a command related thererto. The memory 1830 may include the volatile memory 1832 or the non-volatile memory 1834.

The program 1840 may be stored in the memory 1830 as software, and may include, for example, an operating system (OS) 1842, middleware 1844, or an application 1846.

The input module 1850 may receive a command or data to be used by another component (e.g., the processor 1820) of the electronic device 1801, from the outside (e.g., a user) of the electronic device 1801. The input module 1850 may include, for example, a microphone, a mouse, a keyboard, a key (e.g., a button), or a digital pen (e.g., a stylus pen).

The sound output module 1855 may output sound signals to the outside of the electronic device 1801. The sound output module 1855 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 1860 may visually provide information to the outside (e.g., a user) of the electronic device 1801. The display module 1860 may include, for example, a display, a hologram device, or a projector and control circuitry to control a corresponding one of the display, hologram device, and projector. According to an embodiment, the display module 1860 may include a touch sensor adapted to detect a touch, or a pressure sensor adapted to measure the intensity of force incurred by the touch.

The audio module 1870 may convert a sound into an electrical signal and vice versa. According to an embodiment, the audio module 1870 may obtain the sound via the input module 1850, or output the sound via the sound output module 1855 or a headphone of an external electronic device (e.g., an electronic device 1802) directly (e.g., wiredly) or wirelessly coupled with the electronic device 1801.

The sensor module 1876 may detect an operational state (e.g., power or temperature) of the electronic device 1801 or an environmental state (e.g., a state of a user) external to the electronic device 1801, and then generate an electrical signal or data value corresponding to the detected state. According to an embodiment, the sensor module 1876 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1877 may support one or more specified protocols to be used for the electronic device 1801 to be coupled with the external electronic device (e.g., the electronic device 1802) directly (e.g., wiredly) or wirelessly. According to an embodiment, the interface 1877 may include, for example, a high definition multimedia interface (HDMI), a universal serial bus (USB) interface, a secure digital (SD) card interface, or an audio interface.

A connecting terminal 1878 may include a connector via which the electronic device 1801 may be physically connected with the external electronic device (e.g., the electronic device 1802). According to an embodiment, the connecting terminal 1878 may include, for example, a HDMI connector, a USB connector, a SD card connector, or an audio connector (e.g., a headphone connector).

The haptic module 1879 may convert an electrical signal into a mechanical stimulus (e.g., a vibration or a movement) or electrical stimulus which may be recognized by a user via his tactile sensation or kinesthetic sensation. According to an embodiment, the haptic module 1879 may include, for example, a motor, a piezoelectric element, or an electric stimulator.

The camera module 1880 may capture a still image or moving images. According to an embodiment, the camera module 1880 may include one or more lenses, image sensors, image signal processors, or flashes.

The power management module 1888 may manage power supplied to the electronic device 1801. According to one embodiment, the power management module 1888 may be implemented as at least part of, for example, a power management integrated circuit (PMIC).

The battery 1889 may supply power to at least one component of the electronic device 1801. According to an embodiment, the battery 1889 may include, for example, a primary cell which is not rechargeable, a secondary cell which is rechargeable, or a fuel cell.

The communication module 1890 may support establishing a direct (e.g., wired) communication channel or a wireless communication channel between the electronic device 1801 and the external electronic device (e.g., the electronic device 1802, the electronic device 1804, or the server 1808) and performing communication via the established communication channel. The communication module 1890 may include one or more communication processors that are operable independently from the processor 1820 (e.g., the application processor (AP)) and supports a direct (e.g., wired) communication or a wireless communication. According to an embodiment, the communication module 1890 may include a wireless communication module 1892 (e.g., a cellular communication module, a short-range wireless communication module, or a global navigation satellite system (GNSS) communication module) or a wired communication module 1894 (e.g., a local area network (LAN) communication module or a power line communication (PLC) module). A corresponding one of these communication modules may communicate with the external electronic device via the first network 1898 (e.g., a short-range communication network, such as Bluetooth™, wireless-fidelity (Wi-Fi) direct, or infrared data association (IrDA)) or the second network 1899 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1892 may identify and authenticate the electronic device 1801 in a communication network, such as the first network 1898 or the second network 1899, using subscriber information (e.g., international mobile subscriber identity (IMSI)) stored in the SIM 1896.

The wireless communication module 1892 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 1892 may support a high-frequency band (e.g., the mmWave band) to achieve, e.g., a high data transmission rate. The wireless communication module 1892 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 1892 may support various requirements specified in the electronic device 1801, an external electronic device (e.g., the electronic device 1804), or a network system (e.g., the second network 1899). According to an embodiment, the wireless communication module 1892 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 1897 may transmit or receive a signal or power to or from the outside (e.g., the external electronic device) of the electronic device 1801. According to an embodiment, the antenna module 1897 may include an antenna including a radiating element composed of a conductive material or a conductive pattern formed in or on a substrate (e.g., a printed circuit board (PCB)). According to an embodiment, the antenna module 1897 may include a plurality of antennas (e.g., array antennas). In such a case, at least one antenna appropriate for a communication scheme used in the communication network, such as the first network 1898 or the second network 1899, may be selected, for example, by the communication module 1890 (e.g., the wireless communication module 1892) from the plurality of antennas. The signal or the power may then be transmitted or received between the communication module 1890 and the external electronic device via the selected at least one antenna. According to an embodiment, another component (e.g., a radio frequency integrated circuit (RFIC)) other than the radiating element may be additionally formed as part of the antenna module 1897.

According to one or more embodiments, the antenna module 1897 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1801 and the external electronic device 1804 via the server 1808 coupled with the second network 1899. Each of the electronic devices 1802 or 1804 may be a device of a same type as, or a different type, from the electronic device 1801. According to an embodiment, all or some of operations to be executed at the electronic device 1801 may be executed at one or more of the external electronic devices 1802, 1804, or 1808. For example, if the electronic device 1801 should perform a function or a service automatically, or in response to a request from a user or another device, the electronic device 1801, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1801. The electronic device 1801 may provide the outcome, with or without further processing of the outcome, as at least part of a reply to the request. To that end, a cloud computing, distributed computing, mobile edge computing (MEC), or client-server computing technology may be used, for example. The electronic device 1801 may provide ultra low-latency services using, e.g., distributed computing or mobile edge computing. In another embodiment, the external electronic device 1804 may include an internet-of-things (IoT) device. The server 1808 may be an intelligent server using machine learning and/or a neural network. According to an embodiment, the external electronic device 1804 or the server 1808 may be included in the second network 1899. The electronic device 1801 may be applied to intelligent services (e.g., smart home, smart city, smart car, or healthcare) based on 5G communication technology or IoT-related technology.

The electronic device according to one or more embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that one or more embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with one or more embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

One or more embodiments as set forth herein may be implemented as software (e.g., the program 1840) including one or more instructions that are stored in a storage medium (e.g., internal memory 1836 or external memory 1838) that is readable by a machine (e.g., the electronic device 1801). For example, a processor (e.g., the processor 1820) of the machine (e.g., the electronic device 1801) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to one or more embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to one or more embodiments, each component (e.g., a module or a program) of the above-described components may include a single entity or multiple entities, and some of the multiple entities may be separately disposed in different components. According to one or more embodiments, one or more of the above-described components may be omitted, or one or more other components may be added. Alternatively or additionally, a plurality of components (e.g., modules or programs) may be integrated into a single component. In such a case, according to one or more embodiments, the integrated component may still perform one or more functions of each of the plurality of components in the same or similar manner as they are performed by a corresponding one of the plurality of components before the integration. According to one or more embodiments, operations performed by the module, the program, or another component may be carried out sequentially, in parallel, repeatedly, or heuristically, or one or more of the operations may be executed in a different order or omitted, or one or more other operations may be added.

Figure 19:
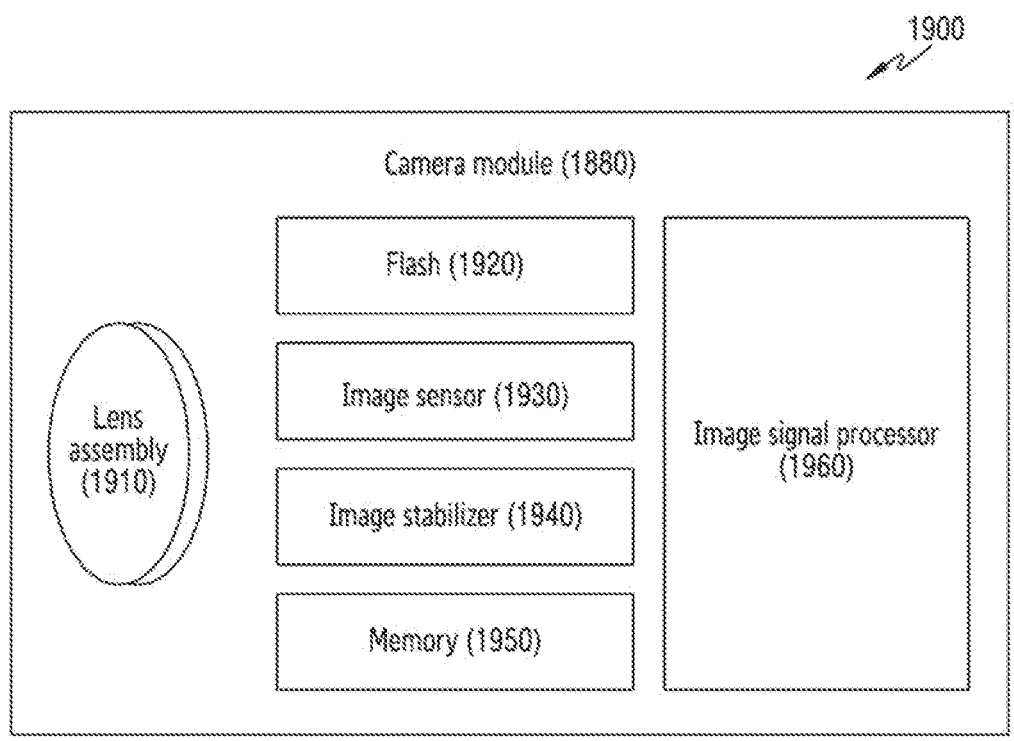
FIG. 19 illustrates a camera module according to one or more embodiments.

FIG. 19 is a block diagram 1900 illustrating the camera module 1880 according to one or more embodiments.

Referring to FIG. 19, the camera module 1880 may include a lens assembly 1910, a flash 1920, an image sensor 1930, an image stabilizer 1940, memory 1950 (e.g., buffer memory), or an image signal processor 1960. The lens assembly 1910 may collect light emitted or reflected from an object whose image is to be taken. The lens assembly 1910 may include one or more lenses. According to an embodiment, the camera module 1880 may include a plurality of lens assemblies 1910. In such a case, the camera module 1880 may form, for example, a dual camera, a 360-degree camera, or a spherical camera. Some of the plurality of lens assemblies 1910 may have the same lens attribute (e.g., view angle, focal length, auto-focusing, f number, or optical zoom), or at least one lens assembly may have one or more lens attributes different from those of another lens assembly. The lens assembly 1910 may include, for example, a wide-angle lens or a telephoto lens.

The flash 1920 may emit light that is used to reinforce light reflected from an object. According to an embodiment, the flash 1920 may include one or more light emitting diodes (LEDs) (e.g., a red-green-blue (RGB) LED, a white LED, an infrared (IR) LED, or an ultraviolet (UV) LED) or a xenon lamp. The image sensor 1930 may obtain an image corresponding to an object by converting light emitted or reflected from the object and transmitted via the lens assembly 1910 into an electrical signal. According to an embodiment, the image sensor 1930 may include one selected from image sensors having different attributes, such as a RGB sensor, a black-and-white (BW) sensor, an IR sensor, or a UV sensor, a plurality of image sensors having the same attribute, or a plurality of image sensors having different attributes. Each image sensor included in the image sensor 1930 may be implemented using, for example, a charged coupled device (CCD) sensor or a complementary metal oxide semiconductor (CMOS) sensor.

The image stabilizer 1940 may move the image sensor 1930 or at least one lens included in the lens assembly 1910 in a particular direction, or control an operational attribute (e.g., adjust the read-out timing) of the image sensor 1930 in response to the movement of the camera module 1880 or the electronic device 1801 including the camera module 1880. This allows compensating for at least part of a negative effect (e.g., image blurring) by the movement on an image being captured. According to an embodiment, the image stabilizer 1940 may sense such a movement by the camera module 1880 or the electronic device 1801 using a gyro sensor or an acceleration sensor disposed inside or outside the camera module 1880. According to an embodiment, the image stabilizer 1940 may be implemented, for example, as an optical image stabilizer.

The memory 1950 may store, at least temporarily, at least part of an image obtained via the image sensor 1930 for a subsequent image processing task. For example, if image capturing is delayed due to shutter lag or multiple images are quickly captured, a raw image obtained (e.g., a Bayer-patterned image, a high-resolution image) may be stored in the memory 1950, and its corresponding copy image (e.g., a low-resolution image) may be previewed via the display module 1860. Thereafter, if a specified condition is met (e.g., by a user's input or system command), at least part of the raw image stored in the memory 1950 may be obtained and processed, for example, by the image signal processor 1960. According to an embodiment, the memory 1950 may be configured as at least part of the memory 1830 or as a separate memory that is operated independently from the memory 1830.

The image signal processor 1960 may perform one or more image processing with respect to an image obtained via the image sensor 1930 or an image stored in the memory 1950. The one or more image processing may include, for example, depth map generation, three-dimensional (3D) modeling, panorama generation, feature point extraction, image synthesizing, or image compensation (e.g., noise reduction, resolution adjustment, brightness adjustment, blurring, sharpening, or softening). Additionally or alternatively, the image signal processor 1960 may perform control (e.g., exposure time control or read-out timing control) with respect to at least one (e.g., the image sensor 1930) of the components included in the camera module 1880. An image processed by the image signal processor 1960 may be stored back in the memory 1950 for further processing, or may be provided to an external component (e.g., the memory 1830, the display module 1860, the electronic device 1802, the electronic device 1804, or the server 1808) outside the camera module 1880. According to an embodiment, the image signal processor 1960 may be configured as at least part of the processor 1820, or as a separate processor that is operated independently from the processor 1820. If the image signal processor 1960 is configured as a separate processor from the processor 1820, at least one image processed by the image signal processor 1960 may be displayed, by the processor 1820, via the display module 1860 as it is or after being further processed.

According to one or more embodiments, an electronic device 100 may include a color filter array including a plurality of color filters having a first grid pattern, an image sensor 120 including the color filter array, and at least one processor electrically connected to the image sensor 120. The at least one processor may acquire image data via a unit pixel (e.g., a unit pixel 510 of FIG. 5) of a pixel array having a second grid pattern forming an angle of 45 degrees with respect to the first grid pattern. There may be at least two of the color filters having different colors and corresponding to the unit pixels.

According to an embodiment, the unit pixel (e.g., a unit pixel 610 of FIG. 6) of the pixel array may have a shape of a quadrangle circumscribing a first color filter of the color filter array.

According to an embodiment, the first color filter may be at least one among a green color filter, a yellow color filter, a white color filter.

According to an embodiment, the unit pixel (e.g., a unit pixel 610 of FIG. 6) may include a first area corresponding to the first color filter, a second area, a third area, a fourth area, and a fifth area defined by the contact of the first color filter and the unit pixel and corresponding to an exterior of the first area. Portions of a second color filters may correspond to the second area and the fourth area. Portions of a third color filters may correspond to the third area and the fifth area.

According to an embodiment, the second area and the fourth area may be arranged to face each other with reference to the center of the first area. The third area and the fifth area may be arranged to face each other with reference to the center of the first area.

According to an embodiment, a center point between the second area and the fourth area, a center point between the third area and the fifth area, and a center point of the first area may coincide with each other.

According to an embodiment, the colors of the second color filter and the third color filter may be different from each other. Respective colors of the second color filter and the third color filter may be at least one among red, green, blue, yellow, emerald, white, cyan, and magenta.

In an embodiment, the unit pixel (e.g., a unit pixel 1010 of FIG. 10) of the pixel array may have a shape of a quadrangle circumscribing four individual color filters surrounding a first color filter of the color filter array.

In an embodiment, the area of the unit pixel (e.g., a unit pixel 1010 of FIG. 10) may be eight times the size of the individual color filter.

In an embodiment, the unit pixel (e.g., a unit pixel 1010 of FIG. 10) may include four times the area of the first color filter, twice the area of the second color filter, and twice the area of the third color filter.

In one or more embodiments, an electronic device 100 may include a color filter array including a plurality of color filters having a first grid pattern, an image sensor 120 including the color filter array, and at least one processor electrically connected to the image sensor 120. The at least one processor may acquire image data via a unit pixel (e.g., a unit pixel 810 of FIG. 8) of a pixel array having a second grid pattern forming an angle of 45 degrees with respect to the first grid pattern. The unit pixels (e.g., unit pixels 810, 820, 830, 840, and 850 of FIG. 8) of the pixel array may include a first area corresponding to a quadrangle inscribed in each color filter included in the plurality of color filters and a second area corresponding to a quadrangle excluding the first area.

In an embodiment, the image sensor 120 may output a first color value through the first area, and output at least one among a second color value and a third color value through the second area. All the areas of visible light may be expressed via the combination of the first color to the third color.

According to an embodiment, the area of the unit pixel (e.g., a unit pixel 810 of FIG. 8) may be ½ the size of the individual color filter.

According to one or more embodiments, a combination of color filters may be a combination of a red color filter, a green color filter, and a blue color filter. A combination of color filters may be a combination of a red color filter, a green color filter, a blue color filter, and a white color filter. A combination of color filters may be a combination of a cyan color filter, a yellow color filter, and a magenta color filter. A combination of color filters may be a combination of a cyan color filter, a yellow color filter, a magenta color filter, and a white color filter.

According to an embodiment, the first grid pattern and the second grid pattern may be a pattern in which quadrangles are repeated.

According to one or more embodiments, an electronic device 100 may include a color filter array, an image sensor 120 including the color filter array, and at least one processor electrically connected to the image sensor 120. The color filter array may include a plurality of octagonal color filters and a plurality of quadrangular color filters. The at least one processor may acquire image data via a unit pixel (e.g., a unit pixel 1260 of FIG. 12) of a pixel array having a grid pattern, and express all the areas of visible light via the combination of color filters corresponding to the unit pixel (e.g., a unit pixel 1260 of FIG. 12).

According to an embodiment, the plurality of octagonal color filters may include a first octagonal filter 1211, a second octagonal filter 1212, a third octagonal filter 1213, fourth octagonal filter 1214, and a fifth octagonal filter 1215, having a first size. The plurality of quadrangular color filters may include a first quadrangular filter 1221, a second quadrangular filter 1222, a third quadrangular filter 1223, and a fourth quadrangular filter 1224, having a second size.

In an embodiment, the first octagonal filter 1211 may include a first edge 1231, a third edge 1233, a fifth edge 1235, and a seventh edge 1237 that have a first length and are spaced apart from each other, and a second edge 1232, a fourth edge 1234, a sixth edge 1236, and an eighth edge 1238 that have a second length and connecting the first edge 1231, the third edge 1233, the fifth edge 1235, and the seventh edge 1237 therebetween, respectively. The second octagonal filter 1212, the third octagonal filter 1213, the fourth octagonal filter 1214, and the fifth octagonal filter 1215 may be in contact with the first edge 1231, the third edge 1233, the fifth edge 1235, and the seventh edge 1237, respectively.

The first quadrangular filter 1221, the second quadrangular filter 1222, the third quadrangular filter 1223, and the fourth quadrangular filter 1224 may be in contact with the second edge 1232, the fourth edge 1234, the sixth edge 1236, and the eighth edge 1238, respectively. The unit pixel (e.g., a unit pixel 1260 of FIG. 12) of the pixel array may be defined as a quadrangle configured by connecting the center 1242 of the second octagonal filter 1212, the center 1243 of the third octagonal filter 1213, the center 1244 of the fourth octagonal filter 1214, and the center 1245 of the fifth octagonal filter 1215.

According to an embodiment, the second octagonal filter 1212 to the fifth octagonal filter 1215 are first color filters, the first quadrangular filter 1221 and the third quadrangular filter 1223 are second color filters, the second quadrangular filter 1222 and the fourth quadrangular filter 1224 are third color filters, and the processor 210 may express all the areas of visible light through the combination of the first color to the third color.

According to an embodiment, the second octagonal filter and the fourth octagonal filter are first color filters, the third octagonal filter and the fifth octagonal filter are second color filters, the first quadrangular filter to the fourth quadrangular filter are third color filters, and the processor 210 may express all the areas of visible light through the combination of the first color to the third color.

According to an embodiment, the second octagonal filter, the fourth octagonal filter, and the first quadrangular filter are first color filters, the third octagonal filter, the fifth octagonal filter, and the third quadrangular filter are second color filters, the second quadrangular filter and the fourth quadrangular filter are third color filters, and the processor 210 may express all the areas of visible light through the combination of the first color to the third color.

What is claimed is:

1. An electronic device comprising:
   a color filter array comprising a plurality of color filters having a first grid pattern;
   an image sensor comprising the color filter array;
   at least one processor electrically connected to the image sensor; and
   memory storing instructions, wherein the instructions, which are executed by the at least one processor individually or collectively, cause the electronic device to acquire image data via unit pixels of a pixel array having a second grid pattern forming an angle of 45 degrees with respect to the first grid pattern,
   wherein at least two of the plurality of color filters comprise different color filters and the at least two of the plurality of color filters correspond to the unit pixels, and
   wherein each of the unit pixels of the pixel array has a shape of a quadrangle circumscribing a first color filter of the plurality of color filters of the color filter array.

2. The electronic device of claim 1, wherein at least two of the plurality of color filters comprises first color filter and second color filter,
   wherein a unit pixel of the unit pixels corresponds to the first color filter and at least a part of the second color filter, and
   wherein the instructions, which are executed by the at least one processor individually or collectively, further cause the electronic device to perform an binning operation in an area corresponding to the at least a part of the second color filter of the unit pixel.

3. The electronic device of claim 1, wherein the first color filter is at least one filter of a group comprising a green color filter, a yellow color filter, and a white color filter.

4. The electronic device of claim 1, wherein:
   each of the unit pixels comprises a first area, a second area, a third area, a fourth area, and a fifth area,
   portions of a plurality of second color filters correspond to the second area and the fourth area, and
   portions of a plurality of third color filters correspond to the third area and the fifth area,
   the first area corresponds to the first color filter,
   the second area, the third area, the fourth area, and the fifth area are defined by a contact of the first color filter and the unit pixel, and the second area, the third area, the fourth area, and the fifth area correspond to an exterior of the first area.

5. The electronic device of claim 4, wherein:
the second area and the fourth area are arranged to face each other with reference to a first center point of the first area, and
the third area and the fifth area are arranged to face each other with reference to a second center point of the first area.

6. The electronic device of claim 4, wherein a first center point between the second area and the fourth area, the second center point between the third area and the fifth area, and a third center point of the first area coincide with each other.

7. The electronic device of claim 4, wherein the plurality of second color filters and the plurality of third color filters are different from each other, and respective colors of the plurality of second color filters and the plurality of third color filters are at least one among red, green, blue, yellow, emerald, white, cyan, and magenta.

8. The electronic device of claim 4, wherein a unit pixel in the pixel array has a shape of a quadrangle circumscribing four individual color filters surrounding the first color filter of the plurality of color filters of the color filter array.

9. The electronic device of claim 8, wherein an area of the unit pixel is eight times a size of the individual color filter.

10. The electronic device of claim 9, wherein:
the area of the unit pixel is twice the area of the first color filter,
the area of the unit pixel is four times the area of the plurality of second color filters, and
the area of the unit pixel is four times the area of the plurality of third color filters.

11. An electronic device comprising:
a color filter array comprising a plurality of color filters having a first grid pattern;
an image sensor comprising the color filter array;
at least one processor electrically connected to the image sensor; and
memory storing instructions,
wherein the instructions, which is executed by the at least one processor individually or collectively, cause the electronic device to acquire image data via unit pixels in a pixel array having a second grid pattern forming an angle of 45 degrees with respect to the first grid pattern,
wherein each of the unit pixels in the pixel array comprises (i) a first area corresponding to a first color filters and (ii) a second area corresponding to areas corresponding to a part of different color filters,
wherein the image sensor is configured to output, through the first area, a first color value, and is configured to output, through the second area, at least one color value among a second color value and a third color value, and
wherein a plurality of combinations of the first color, the second color, and the third color represent areas of visible light.

12. The electronic device of claim 11, wherein the image sensor is configured to:
output the second color by performing interpolation a part of a second color filter of the different color filters corresponding to the second area, and
output the third color by performing interpolation a part of a third color filter of the different color filters corresponding to the second area.

13. The electronic device of claim 11, wherein a combination of color filters is at least one combination among (i) a combination of a red color filter, a green color filter, and a blue color filter, (ii) a combination of a red color filter, a green color filter, a blue color filter, and a white color filter, (iii) a combination of a cyan color filter, a yellow color filter, and a magenta color filter, or (iv) a combination of a cyan color filter, a yellow color filter, a magenta color filter, and a white color filter.

14. The electronic device of claim 11, wherein either the first grid pattern or the second grid pattern is a pattern in which quadrangles are repeated.

* * * * *